(12) United States Patent
Takamatsu et al.

(10) Patent No.: US 7,498,625 B2
(45) Date of Patent: Mar. 3, 2009

(54) SEMICONDUCTOR DEVICE AND MANUFACTURING METHOD THEREOF

(75) Inventors: Tomohiro Takamatsu, Kawasaki (JP); Jirou Miura, Kawasaki (JP); Mitsuhiro Nakamura, Kawasaki (JP); Hirotoshi Tachibana, Kawasaki (JP); Genichi Komuro, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/300,272

(22) Filed: Dec. 15, 2005

(65) Prior Publication Data

US 2006/0091438 A1 May 4, 2006

Related U.S. Application Data

(63) Continuation of application No. PCT/JP03/11348, filed on Sep. 5, 2003.

(51) Int. Cl.
*H01L 29/76* (2006.01)
(52) U.S. Cl. ............... 257/295; 257/E21.664; 438/3
(58) Field of Classification Search ......... 257/307–308, 257/295, E21.664; 438/3
See application file for complete search history.

(56) References Cited

U.S. PATENT DOCUMENTS

| 5,350,705 A * | 9/1994 | Brassington et al. ........ 257/295 |
| 5,638,319 A * | 6/1997 | Onishi et al. ................ 365/145 |
| 5,721,700 A * | 2/1998 | Katoh ......................... 365/145 |
| 6,005,291 A | 12/1999 | Koyanagi et al. |
| 6,046,490 A * | 4/2000 | Arita et al. .................. 257/535 |
| 6,284,146 B1 * | 9/2001 | Kim et al. ...................... 216/6 |
| 6,316,797 B1 * | 11/2001 | Van Buskirk et al. ....... 257/295 |
| 6,326,671 B1 * | 12/2001 | Nagano et al. .............. 257/486 |
| 6,903,917 B2 * | 6/2005 | Higashi et al. ........... 361/306.1 |

FOREIGN PATENT DOCUMENTS

| EP | 1283545 A2 | 2/2003 |
| JP | 2-8137 | 1/1990 |
| JP | 4-92428 | 3/1992 |
| JP | 08017759 A | 1/1996 |
| JP | 10-302481 | 11/1998 |
| JP | 11145422 A | 5/1999 |
| JP | 2002100740 A | 4/2002 |
| JP | 2002-252336 | 9/2002 |
| JP | 2003-100994 | 4/2003 |
| JP | 2003-133292 | 5/2003 |

* cited by examiner

*Primary Examiner*—Jerome Jackson, Jr.
*Assistant Examiner*—Jose R Diaz
(74) *Attorney, Agent, or Firm*—Westerman, Hattori, Daniels & Adrian, LLP.

(57) ABSTRACT

A ferroelectric capacitor including a bottom electrode (15), a ferroelectric film (16) and a top electrode (17) is covered with an interlayer insulating film (18). One end of the bottom electrode (15) is formed like comb teeth. To match with the remaining portion of that end, a plurality of contact holes (21) are formed in the interlayer insulating film (18). In other words, gaps (notches) are formed in the bottom electrode (15) between lower ends of at least two of the contact holes (21). And a wiring (25) connected to the bottom electrode (15) through the contact holes (21) is formed on the interlayer insulating film (18).

43 Claims, 20 Drawing Sheets

15  11  16  17

15  16  17

PRIOR ART

SEMICONDUCTOR DEVICE AND MANUFACTURING METHOD THEREOF

This application is a continuation of international application PCT/JP2003/011348 filed on Sep. 5, 2003.

TECHNICAL FIELD

The present invention relates to a semiconductor device which improves contact between an electrode of a ferroelectric capacitor and a wiring, and a manufacturing method thereof.

BACKGROUND ART

In recent years, a ferroelectric memory (FeRAM) has been drawing attention, as a nonvolatile memory that can hold information even when power supply is cut off. The FeRAM utilizes hysteresis characteristics of a ferroelectric to store information. In the ferroelectric memory, a ferroelectric capacitor is provided in each memory cell. In a ferroelectric capacitor, a ferroelectric film is provided as a capacitor dielectric between a pair of electrodes. A ferroelectric capacitor becomes polarized in accordance with an applied voltage between the pair of electrodes, and its spontaneous polarization remains even though the applied voltage is removed, whereby information can be held. When the polarity of the applied voltage is reversed, the polarity of the spontaneous polarization is also reversed. The spontaneous polarization enables can be detected to read information.

In addition, because the capacitance of the ferroelectric film is larger than that of $SiO_2$, a ferroelectric capacitor may be integrated in a boosting circuit or a smoothing circuit. A bottom electrode, a ferroelectric film, and a top electrode of a ferroelectric capacitor integrated in the boosting circuit or the smoothing circuit are all larger in size than those of a ferroelectric capacitor incorporated in the memory cell. Therefore, a great number of contact holes are formed on the bottom electrode.

Here, a conventional method of manufacturing a semiconductor device having a peripheral circuit including a ferroelectric capacitor will be explained. FIGS. 18A and 18B to FIGS. 20A and 20B are diagrams illustrating a conventional method of manufacturing a semiconductor device. FIGS. 18B, 19B, and 20B are cross-sectional views taken along the line II-II in FIGS. 18A, 19A, and 20A, respectively.

To manufacture such a semiconductor device (ferroelectric memory), an element such as a CMOS transistor is first formed on a semiconductor substrate, e.g., an Si substrate; then, an interlayer insulating film, wirings, and the like are formed, and then, as shown in FIGS. 18A and 18B, an alumina film 111 is formed as an adhesion layer (base film) of a ferroelectric capacitor. Next, a conductive film for a bottom electrode (a bottom electrode film) and a ferroelectric film are sequentially formed on the alumina film 111. A Pt film is formed as the bottom electrode film, and a $Pb(Zr,Ti)O_3$ film (a PZT film) is formed as the ferroelectric film. Next, the ferroelectric film is crystallized by heat treatment. Thereafter, an $IrO_x$ film is formed as a conductive film for a top electrode (a top electrode film) on the ferroelectric film. Next, by processing the top electrode film, the ferroelectric film, and the bottom electrode film in that order, a plurality of ferroelectric capacitors (not shown) are formed in an area in which an FeRAM cell array is to be formed, and, as shown in FIGS. 18A and 18B, a bottom electrode 115, a PZT film 116, and a top electrode 117 are formed in an area in which a peripheral circuit including a boosting circuit and a smoothing circuit is to be formed.

In addition, a planar shape of each of the bottom electrodes 115 is a rectangle having a narrow side of 50 μm to 60 μm in length and a longitudinal side of 200 μm to 250 μm in length. Meanwhile, a planar shape of the bottom electrode in the ferroelectric memory cell array is a rectangle having a narrow side of 4.0 μm in length and a longitudinal side of 560 μm in length.

After processing these films, a TEOS oxide film 118 is formed as an interlayer insulating film and flattened through CMP (Chemical Mechanical Polishing) Next, in the TEOS oxide film 118, the alumina film 111, and the like, contact holes (not shown) are formed to reach a diffusion layer (semiconductor substrate) or the like formed below the bottom electrode 115. Thereafter, as shown in FIGS. 19A and 19B, contact holes 121 that reach the bottom electrode 115 and contact holes 122 that reach the top electrode 117 are formed in the TEOS oxide film 118. In this situation, a plurality of contact holes 121 are formed for each of the bottom electrodes 117.

Next, on the entire surface, a TiN film (about 150 nm) as a lower barrier metal film, an Al film, and a TiN film as an upper-barrier metal film are formed and patterned to form a wiring 125 connected through all of the contact holes 121 to the bottom electrode 115 and a wiring 126 connected through the contact holes 122 to the top electrode 117, as shown in FIGS. 20A and 20B.

In addition, also in the ferroelectric memory cell array section, wirings are formed concurrently with the peripheral circuit section.

Next, after forming an interlayer insulating film that covers the wirings 125 and 126, heat treatment for eliminating moisture in the interlayer insulating film is implemented for 60 minutes, in the presence of $N_2$ at 350° C.

Thereafter, by further forming wirings, interlayer insulating films, and the like, a semiconductor device is completed.

However, when the inventor of the present invention actually observed a surface of a semiconductor device that was produced in accordance with the conventional method as described above, a recess-like defect was found in the vicinity of the contact portion of the bottom electrode for the peripheral circuit section. Such a defect as described above was not found in the memory cell array section. In order to identify what the defect was, the inventor carried out cross-sectional observation and composition analysis. FIGS. 21A to 21C are graphs representing the results of the composition analysis on a wiring in the vicinity of the contact portion. In the cross-sectional observation, it was found that discoloration in the wiring had occurred in the vicinity of the contact portion of the bottom electrode. Moreover, as shown in FIGS. 21A to 21C, peaks of Si and Pt appeared in the region where, in a normal situation, a peak of Al would conspicuously emerge. This fact suggests that, due to reaction, these atoms diffused into the wiring.

Meanwhile, in a semiconductor device including a ferroelectric capacitor, in order to improve the characteristics of the ferroelectric film, annealing processing in the presence of oxygen after formation of the top electrode is requisite. Therefore, as a material for the electrode, an oxidization-proof material, or a material that maintains electrical conductivity even when being oxidized, has been utilized. As the foregoing material, metal of the platinum family or oxide thereof, such as Pt, Ir, or $IrO_x$, is mainly utilized. As another material for the wiring, Al is utilized, which is generally used even in other kind of semiconductor devices. The ferroelectric capacitor is connected through Al wirings to other elements or the like. In this situation, the thickness of the ferroelectric film is relatively large, and the dimension of the capacitor in the vertical direction is also relatively large. Therefore, a contact hole to the capacitor electrode is likely to be deep. An Al wiring is formed through the deep contact hole.

However, it is known that contact between Al and platinum-family metal such as Pt causes eutectic reaction; as disclosed in specifications of Japanese Patents No. 3045928 and No. 3165093, it is necessary to form between them a barrier metal film such as a TiN film. In other words, as shown in FIG. 22, a ferroelectric capacitor having a bottom electrode 148 made of Pt is formed on an insulating film 145, and an insulating film 146 is formed in such a way as to cover the ferroelectric capacitor. In the insulating film 146, a contact hole reaching the bottom electrode 148 is formed, and a barrier metal film 151 and a wiring 152 that are connected through the contact hole to the bottom electrode 148 are formed on the insulating film 146. The barrier metal film 151 and the wiring 152 are made of TiN and Al, respectively.

However, crystals of Pt and TiN are oriented in the same direction; therefore, if heat treatment is implemented after the Al wiring is formed on the TiN barrier metal film, Pt may pass through the TiN barrier metal film and react with Al. If the reaction such as this occurs, not only contact defect is caused, but also upward elevation occurs, whereby wirings in further upper layers may be affected.

Although, in logic products, a stacked barrier metal film formed by stacking a TiN film on a Ti film is usually utilized, in a ferroelectric capacitor, a Ti film absorbs $O_2$ from a platinum-family metal oxide used as the electrode, at the contact interface, whereby a $TiO_x$ layer is formed. Consequently, contact resistance becomes higher. Japanese Patent Application Laid-Open No. 2002-100740 describes a stacked barrier metal film having a Ti film formed on a TiN film. However, the structure causes Ti and Al to react and generate electromigration.

[Patent Document 1]
Specification of Japanese Patent No. 3045928
[Patent Document 2]
Specification of Japanese Patent No. 3165093
[Patent Document 3]
Japanese Patent Application Laid-Open No. 2002-100740

SUMMARY OF THE INVENTION

An object of the present invention is to provide a semiconductor device capable of suppressing a reaction between an electrode of a ferroelectric capacitor and a wiring to obtain a good contact portion, and a manufacturing method thereof.

The semiconductor device according to a first invention and a second invention of the present application is targeted for a semiconductor device comprising a ferroelectric capacitor including a bottom electrode, a ferroelectric film and a top electrode, an interlayer insulating film formed on the ferroelectric capacitor, in the interlayer insulating film a plurality of contact holes are formed to the bottom electrode, and a wiring formed on the interlayer insulating film and connected to the bottom electrode via through contact holes.

A first invention is characterized in that a gap is formed in the bottom electrode between lower ends of at least two of the contact holes. A second invention is characterized in that a gap is formed in the wiring between upper ends of at least two of the contact holes.

The semiconductor device according to a third invention of the present application is targeted for a semiconductor device comprising a ferroelectric capacitor including a bottom electrode, a ferroelectric film and a top electrode, an interlayer insulating film formed on the ferroelectric capacitor, in the interlayer insulating film a plurality of contact holes are formed to the bottom electrode, a wiring formed on the interlayer insulating film and connected to the bottom electrode through the contact holes, and a barrier metal film formed between the bottom electrode and the wiring. The third invention is characterized in that the barrier metal film comprises a first TiN film in direct contact with the bottom electrode, a Ti film formed on the first TiN film, and a second TiN film formed on the Ti film.

The semiconductor device according to a fourth invention of the present application is targeted for, as with the first and second inventions, a semiconductor device comprising a ferroelectric capacitor including a bottom electrode, a ferroelectric film and a top electrode, an interlayer insulating film formed on the ferroelectric capacitor, in the interlayer insulating film a plurality of contact holes are formed to the bottom electrode, and the wiring formed on the interlayer insulating film and connected to the bottom electrode through the contact holes. The fourth invention is characterized in that the wiring includes an Ir film or a Pt film.

DETAILED DESCRIPTION OF THE PREFERRED EMBODIMENTS

Hereinafter, embodiments of the present invention will be described concretely with referring to the attached drawings. For convenience, the following embodiments will describe a structure of a semiconductor device together with a manufacturing method thereof as appropriate.

First Embodiment

Figure 1:
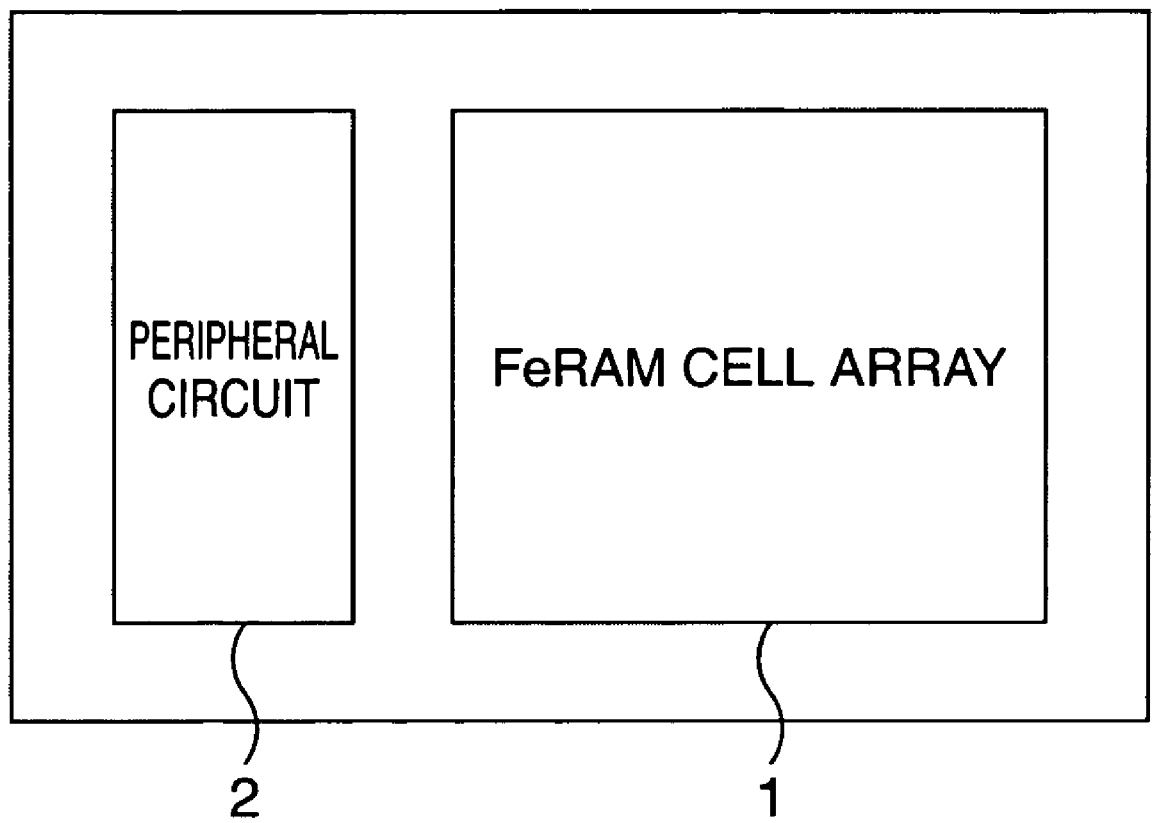
FIG. 1 is a schematic view showing a semiconductor device according to a first embodiment of the present invention.
Figure 4A:
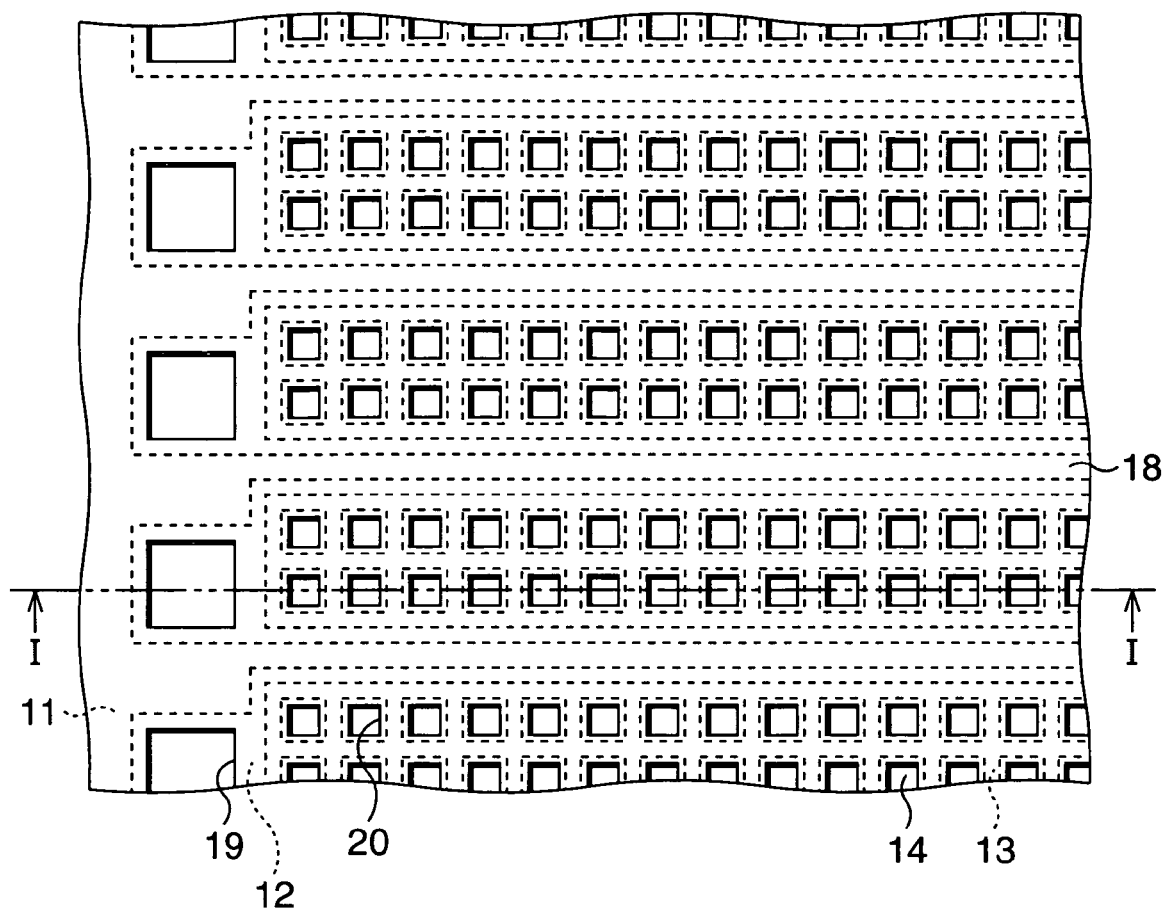
FIGS. 4A and 4B are views, following FIGS. 2A and 2B, showing the manufacturing method of the semiconductor device according to the first embodiment of the present invention.
Figure 4B:
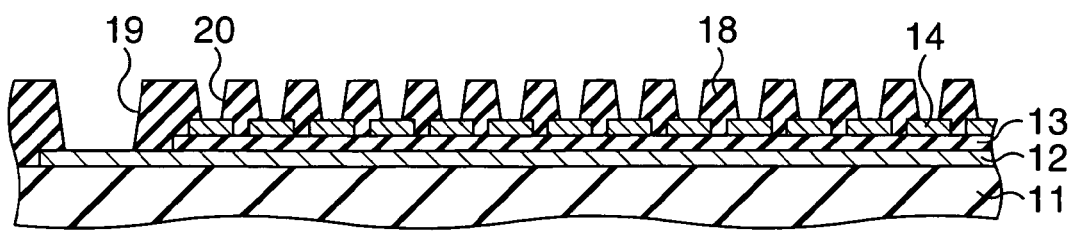
Figure 5A:
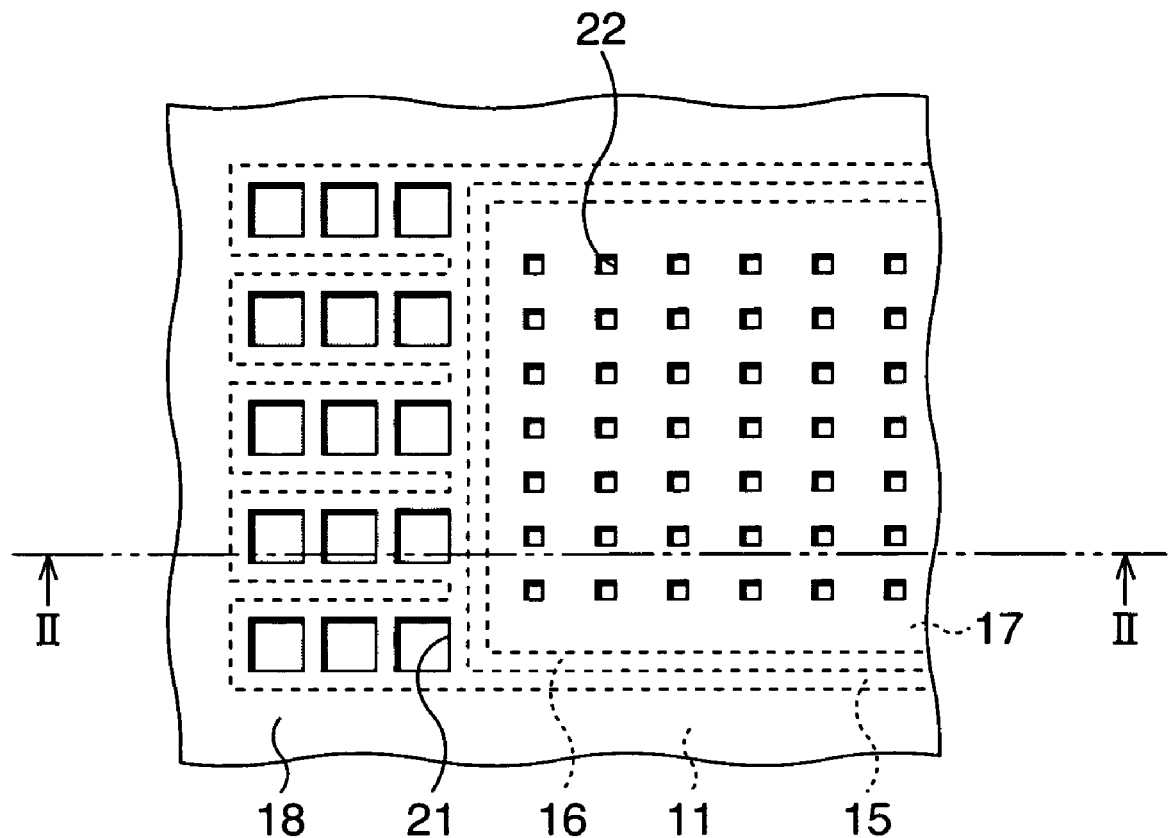
FIGS. 5A and 5B are views, following FIGS. 3A to 3C, showing the manufacturing method of the semiconductor device according to the first embodiment of the present invention.
Figure 5B:
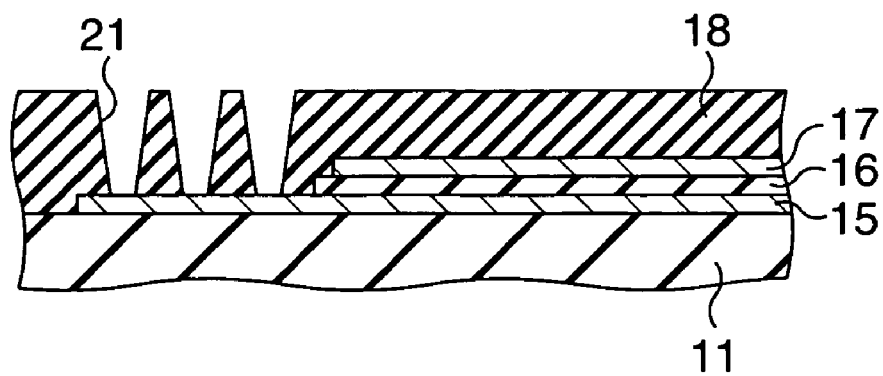

To begin with, a first embodiment of the present invention will be described. FIG. 1 is a schematic view showing a semiconductor device according to the first embodiment of the present invention. FIGS. 2A and 2B to FIGS. 7A and 7B are views showing a manufacturing method of the semiconductor device according to the first embodiment of the present invention. FIGS. 2B, 4B and 6B are sectional views along lines I-I in FIGS. 2A, 4A and 6A, respectively. FIGS. 3B, 5B and 7B are sectional views along lines II-II in FIGS. 3A, 5A and 7A, respectively. FIG. 3C is a sectional view along a line III-III in FIG. 3A.

The first embodiment is provided with a FeRAM cell array 1 and a peripheral circuit 2. The FeRAM cell array 1 is provided with a plurality of FeRAM cells which are arranged. The peripheral circuit 2 is provided with circuits necessary to write, read and erase information on the FeRAM cell array 1, such as a boosting circuit and a smoothing circuit.

Figure 2A:
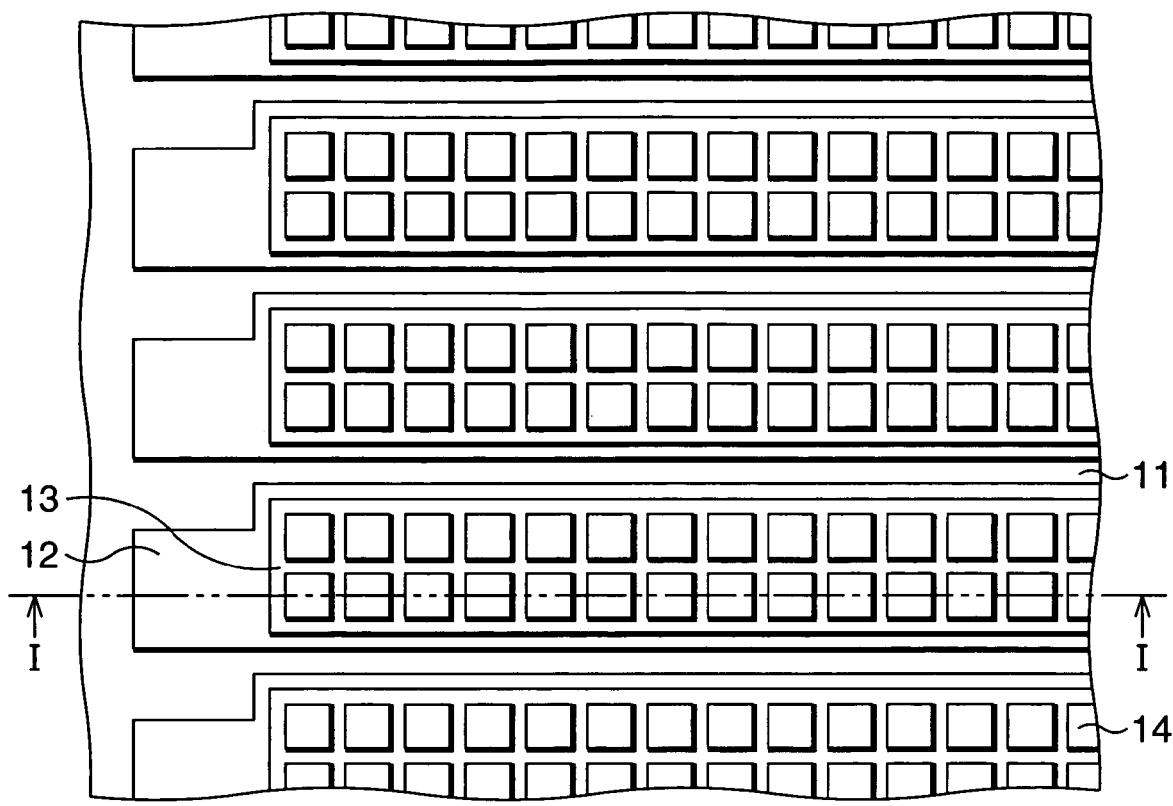
FIGS. 2A and 2B are views showing a manufacturing method of the semiconductor device according to the first embodiment of the present invention, showing an area equivalent to a FeRAM cell array 1.
Figure 2B:
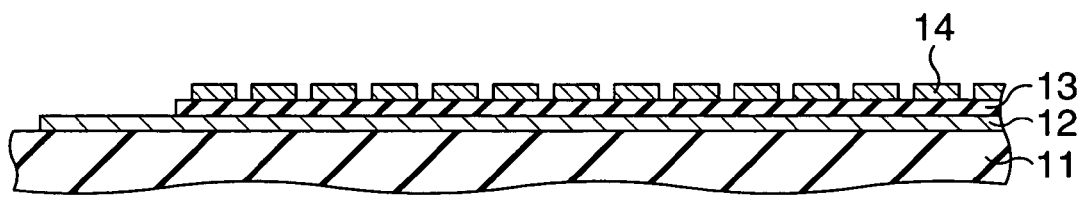
Figure 3A:
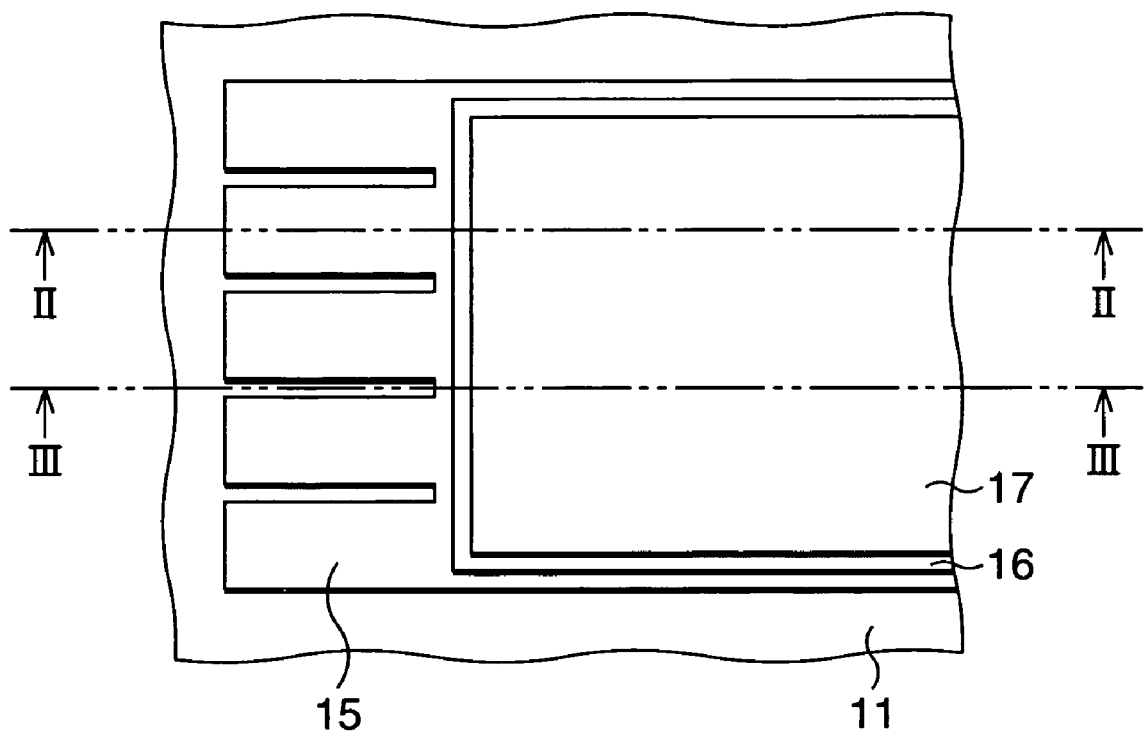
FIGS. 3A to 3C are views showing the manufacturing method of the semiconductor device according to the first embodiment of the present invention, showing an area equivalent to a peripheral circuit 2.
Figure 3B:
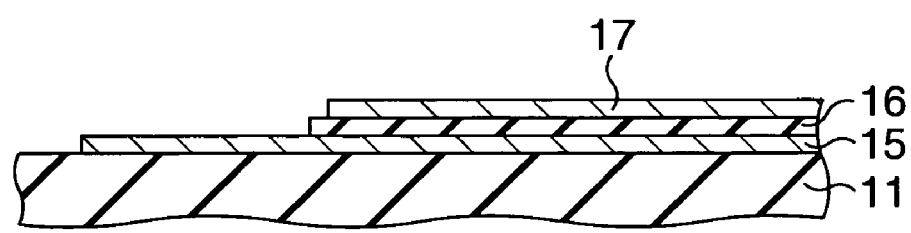
Figure 3C:
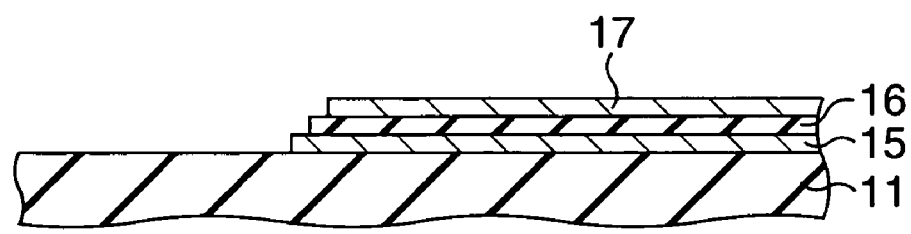

To manufacture such a semiconductor device (ferroelectric memory), according to the first embodiment, an element such as a CMOS transistor is first formed on a semiconductor substrate, e.g., an Si substrate, and then an interlayer insulating film, a wiring and so on are formed, and an alumina film 11 is formed as an adhesion layer (base film) of the ferroelectric capacitor as shown in FIGS. 2A, 2B, 3A and 3B. Next, a conductive film for a bottom electrode (a bottom electrode film) and a ferroelectric film are sequentially formed on the alumina film 11. As for the bottom electrode film, a Pt film about 150 nm thick is formed for instance. As for the ferroelectric film, a $Pb(Zr,Ti)O_3$ film (PZT film) about 150 nm thick is formed for instance. Next, the ferroelectric film is crystallized by performing rapid heat treatment at about 750° C. Thereafter, an $IrO_x$ film about 250 nm thick, for instance, is formed as a conductive film for a top electrode (a top electrode film) on the ferroelectric film. These films are processed in order of the top electrode film, the ferroelectric film, and the bottom electrode film so as to form a bottom electrode 12, a PZT film 13, and a top electrode 14 in an area in which the FeRAM cell array 1 is to be formed (a second area), as shown in FIGS. 2A and 2B, and so as to form a bottom electrode 15, a PZT film 16, and a top electrode 17 in an area in which the peripheral circuit 2 is to be formed (a first area), as shown in FIGS. 3A and 3B.

Here, a description will be given as to forms of the bottom electrode 12, PZT film 13 and top electrode 14, and the bottom electrode 15, PZT film 16 and top electrode 17.

In the first area, a plurality of bottom electrodes 15 are formed. The planar shape of each of the bottom electrodes 15 is a rectangle having a narrow side of 50 μm to 60 μm in length and a longitudinal side of 200 μm to 250 μm in length. A portion of 10 μm at one end of a longitudinal direction is divided in a comb-teeth state with a plurality of notches (gaps) extended in the longitudinal direction, as shown in FIGS. 3A, 3B and 3C. Width of a remaining divided portion (comb-teeth portion) is about 0.5 μm for instance. The PZT film 16 is formed for each bottom electrode 15, and spacing with the notch formed to the bottom electrode 15 is about 1 μm. The top electrode 17 is also formed for each bottom electrode 15.

In the second area, a plurality of bottom electrodes 12 are also formed. The planar shape of each of the bottom electrodes 12 is roughly a rectangle having a narrow side of 4.0 μm in length and a longitudinal side of 560 μm in length (reed shape). Therefore, the bottom electrode 12 is very small compared with the bottom electrode 15. The PZT film 13 is formed in the reed shape for each bottom electrode 12, and the top electrode 14 is formed for each memory cell. The planar shape of the top electrode 14 is of a rectangle having a narrow side of 1.15 μm in length and a longitudinal side of 1.8 μm in length.

After processing these films, a TEOS oxide film 18 about 1.5 μm thick, for instance, is formed as an interlayer insulating film and is flattened through CMP. Next, in the TEOS oxide film 18, the alumina film 11 and the like, contact holes (not shown) are formed to reach a diffusion layer (semiconductor substrate) or the like formed below the bottom electrodes 12 and 15. Next, contact holes 21 reaching the bottom electrode 15 and contact holes 22 reaching the top electrode 17 are formed in the TEOS oxide film 18 in the first area, as shown in FIGS. 5A and 5B, and contact holes 19 reaching the bottom electrode 12 and contact holes 20 reaching the top electrode 14 are formed in the TEOS oxide film 18 in the second area, as shown in FIGS. 4A and 4B. In this case, in the first area, the contact holes 21 are formed on the end of the side having the notch formed for each of the bottom electrode 15 at intervals of about 1.3 μm in the longitudinal direction. In the second area, the one contact hole 19 is formed for each of the bottom electrode 14. The planar shape of the contact holes 19 and 21 is a square 1.8 μm on a side, for instance.

Figure 6A:
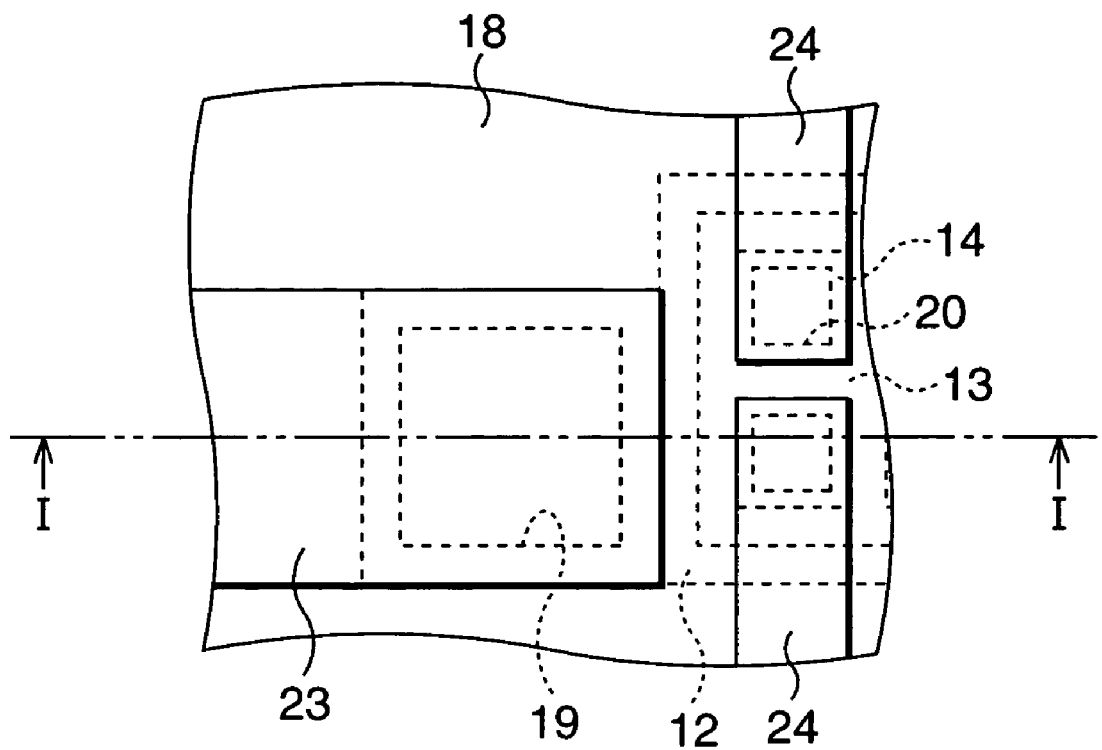
FIGS. 6A and 6B are views, following FIGS. 4A and 4B, showing the manufacturing method of the semiconductor device according to the first embodiment of the present invention.
Figure 6B:
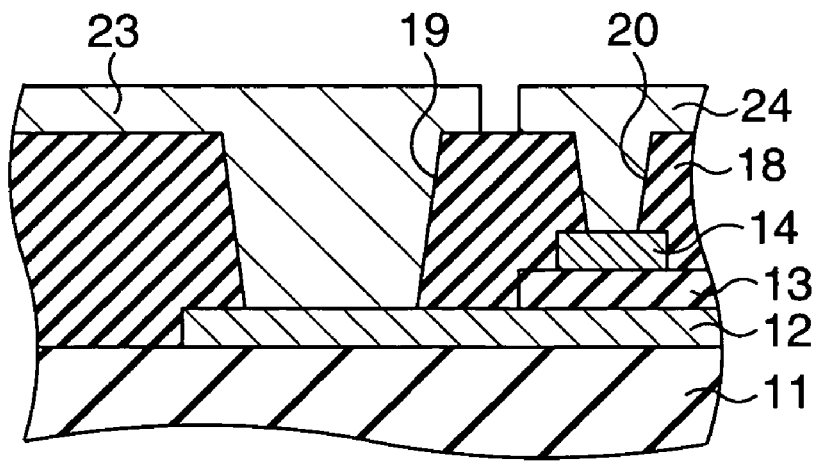
Figure 7A:
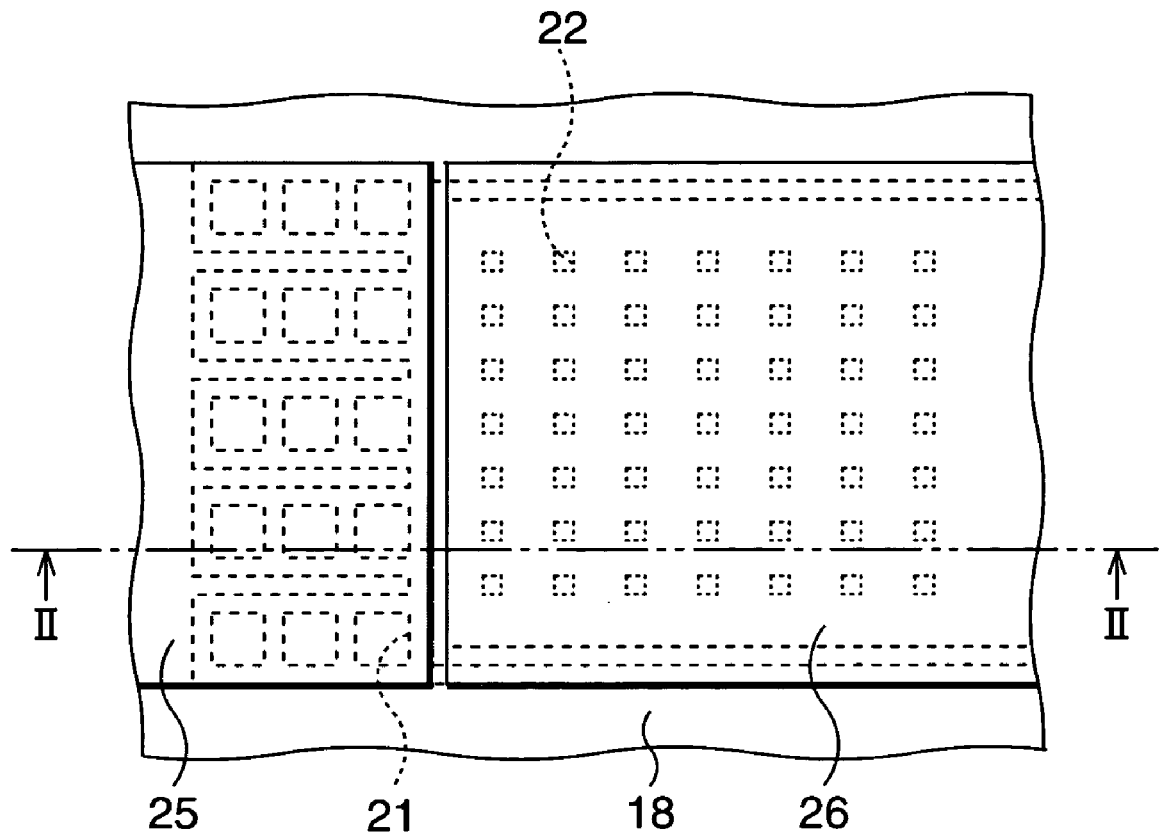
FIGS. 7A and 7B are views, following FIGS. 5A and 5B, showing the manufacturing method of the semiconductor device according to the first embodiment of the present invention.
Figure 7B:
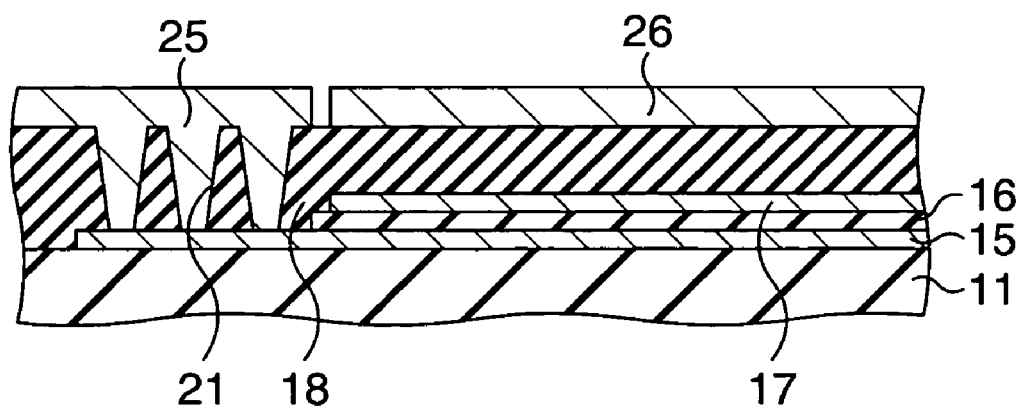

Next, a barrier metal film, an Al film and a barrier metal film are formed on the entire surface and patterned so as to form a wiring portion 23 connected through the contact holes 19 to the bottom electrode 12, and a wiring portion 24 connected through the contact holes 20 to the top electrode 14, as shown in FIGS. 6A and 6B, and also so as to form a wiring portion 25 connected through all of the contact holes 21 to the bottom electrode 15 and a wiring portion 26 connected through the contact holes 22 to the top electrode 17, as shown in FIGS. 7A and 7B. In this case, the wiring portion 24 is formed for each of the top electrode 14. As for the barrier metal film, Al film (Al wire) and barrier metal film configuring the wiring portions 23 to 26, a TiN film about 150 nm thick, an Al film about 550 nm thick, and a TiN film about 150 nm thick are formed, respectively, for instance. However, they are not limited thereto. For instance, the barrier metal film may be configured by a TiN film, a Ti film and a TiN film as with the embodiments described later.

Thereafter, to eliminate moisture in the interlayer insulating film 18, heat treatment is implemented for 60 minutes in an atmosphere of $N_2$ at 350° C. And then, the semiconductor device (ferroelectric memory) is completed by further forming the upper-layer wirings, interlayer insulating films and the like.

Conventionally, the FeRAM cell array has had no reaction between the wiring and the bottom electrode so that no problem has occurred. This is presumably because the contact holes occupy the most area in the area where the bottom electrode overlaps the Al wire on a plan view and the amount of Pt and Al which react with each other are small. According to the present embodiment, the area of the portion deviated from the contact holes 21 of the bottom electrode 15 becomes smaller in comparison with the conventional structure as the notches are formed so that the amount of Pt which reacts is reduced. Consequently, the reaction between the bottom electrode 15 and the Al wire in the wiring portion 25 hardly occurs, and so it is possible to avoid the problems such as rise in contact resistance, breaking and deformation.

Conventionally, it is the TiN film as a diffusion barrier film that is in contact with the bottom electrode consisting of Pt. Therefore, abnormal reaction (eutectic reaction) between Pt and Al occurs in spite of intervention of the TiN film, presumably because a diffusion barrier property of the TiN film is insufficient. It is also thinkable, considering no occurrence of the eutectic reaction in the memory cells, that a layout of the bottom electrode, the number of contact holes and the layout of wirings influence the eutectic reaction. Therefore, to suppress the eutectic reaction between Pt and Al in the peripheral circuit portion, the solutions can be improving the diffusion barrier property of the TiN film and having the layout hardly causing the reaction.

To improve the barrier property of the TiN film, film quality of the TiN film should be improved and its film thickness should be increased. However, these countermeasures cannot be applied as-is in terms of the influence on the ferroelectric capacitor and reliability of the wiring. In comparison, adjustment of the layout hardly causes change in performance because there is no need to change process conditions so that it is easy to implement.

Second Embodiment

Next, a second embodiment of the present invention will be described. The second embodiment adopts the same manufacturing method as the first embodiment as to the FeRAM cell array 1. However, the structure and the manufacturing method of the peripheral circuit 2 are different form those of the first embodiment. FIGS. 8A and 8B to FIGS. 10A and 10B are the views showing the manufacturing method of the semiconductor device according to the second embodiment of the present invention. FIGS. 8B, 9B and 10B are the sectional views along lines II-II in FIGS. 8A, 9A and 10A, respectively.

Figure 8A:
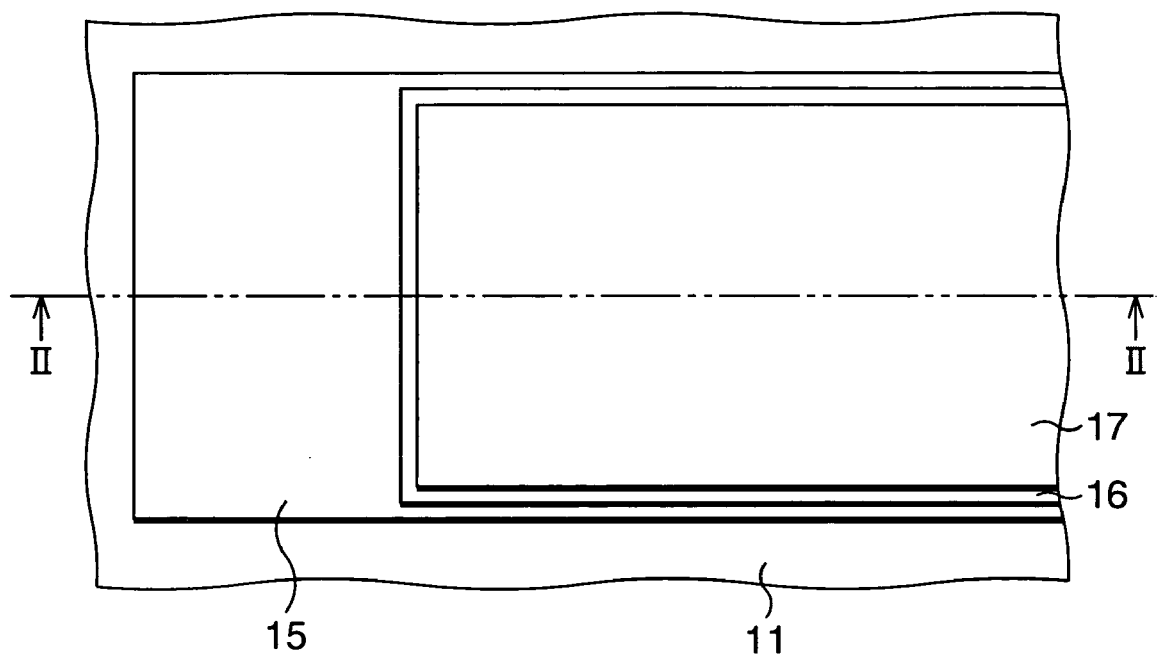
FIGS. 8A and 8B are views showing a manufacturing method of a semiconductor device according to a second embodiment of the present invention.
Figure 8B:
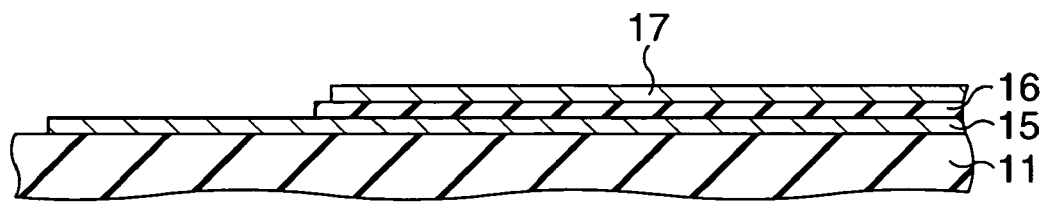
Figure 9A:
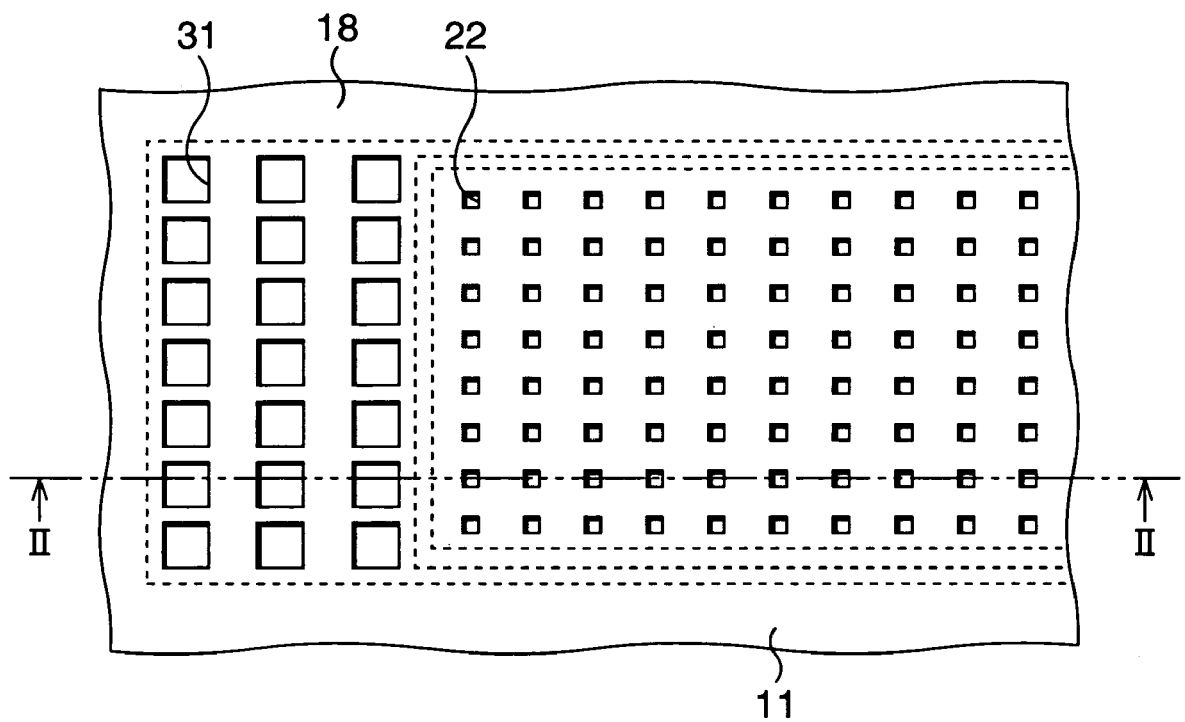
FIGS. 9A and 9B are views, following FIGS. 8A and 8B, showing the manufacturing method of the semiconductor device according to the second embodiment of the present invention.
Figure 9B:
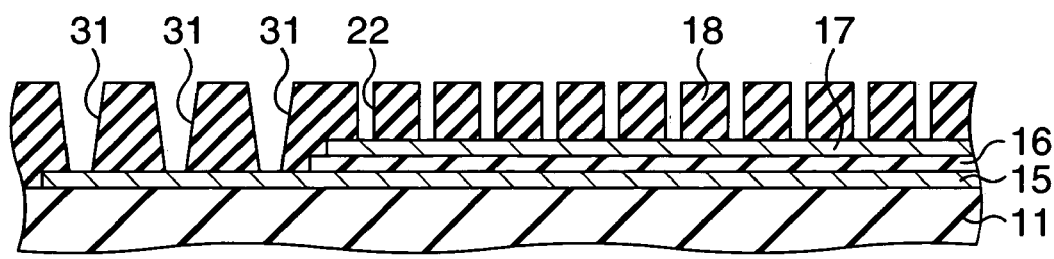

According to the second embodiment, as with the first embodiment, an element such as a CMOS transistor is first formed on a semiconductor substrate, e.g., an Si substrate, and then an interlayer insulating film, a wiring and so on are formed, and an alumina film 11 is formed, as shown in FIGS. 8A and 8B. Next, a bottom electrode film and a ferroelectric film are sequentially formed on the alumina film 11. As for the bottom electrode film, a Pt film about 150 nm thick is formed for instance. As for the ferroelectric film, a PZT film about 150 nm thick is formed for instance. Next, the ferroelectric film is crystallized by performing rapid heat treatment at about 750° C. Thereafter, an $IrO_x$ film about 250 nm thick, for instance, is formed as a top electrode film on the ferroelectric film. These films are processed in order of the top electrode film, the ferroelectric film, and the bottom electrode film so as to form a bottom electrode 12, a PZT film 13, and a top electrode 14 (refer to FIGS. 2A and 2B) in an area in which the FeRAM cell array 1 is to be formed (second area) and so as to form a bottom electrode 15, a PZT film 16, and a top electrode 17 in an area in which the peripheral circuit 2 is to be formed (first area), as shown in FIGS. 8A and 8B. According to the second embodiment, however, the planar shape of each of the bottom electrodes 15 is roughly a rectangle having a narrow side of 50 μm to 60 μm in length and a longitudinal side of 200 μm to 250 μm in length without forming a notch.

After processing these films, a TEOS oxide film 18 about 1.5 μm thick, for instance, is formed as an interlayer insulating film and is flattened through CMP. Next, in the TEOS oxide film 18, the alumina film 11 and the like, contact holes (not shown) are formed to reach a diffusion layer (semiconductor substrate) or the like formed below the bottom electrodes 12 and 15. Next, contact holes 31 reaching the bottom electrode 15 and contact holes 22 reaching the top electrode 17 are formed in the TEOS oxide film 18 in the first area, as shown in FIGS. 9A and 9B, and contact holes 19 reaching the bottom electrode 12 and contact holes 20 reaching the top electrode 14 are formed in the TEOS oxide film 18 in the second area (refer to FIGS. 4A and 4B). In this case, in the first area, a plurality of contact holes 31 are formed for each of the bottom electrode 15 at intervals of about 1.3 μm on one end in the longitudinal direction.

Figure 10A:
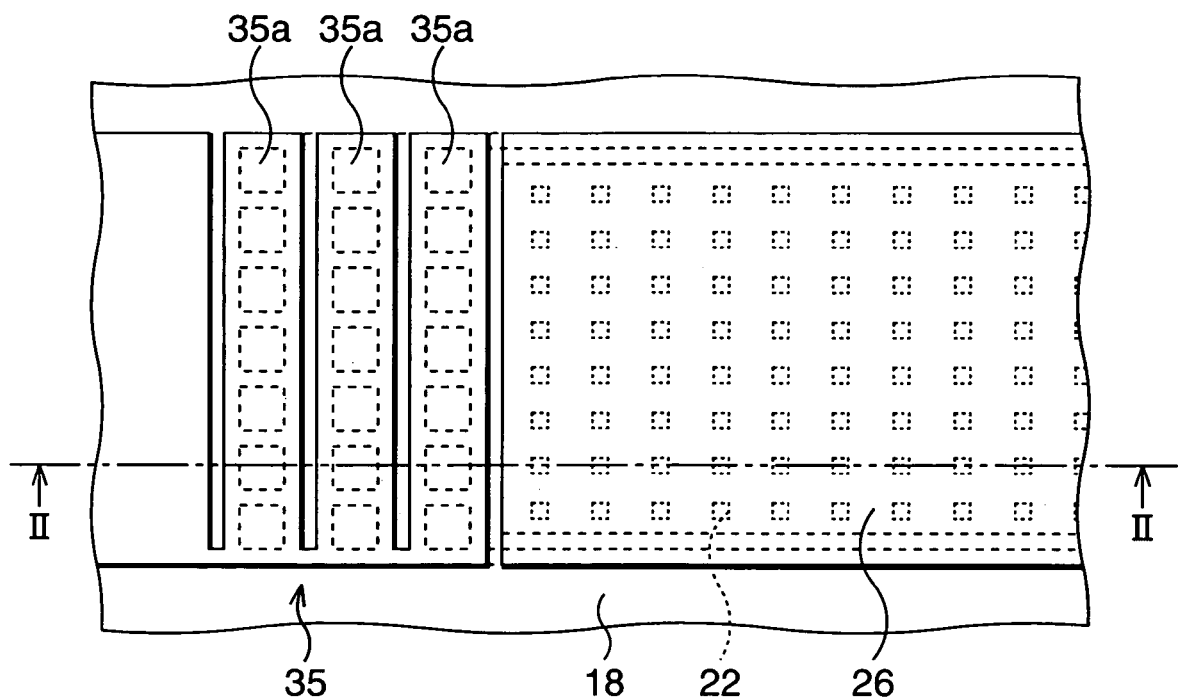
FIGS. 10A and 10B are views, following FIGS. 9A and 9B, showing the manufacturing method of the semiconductor device according to the second embodiment of the present invention.
Figure 10B:
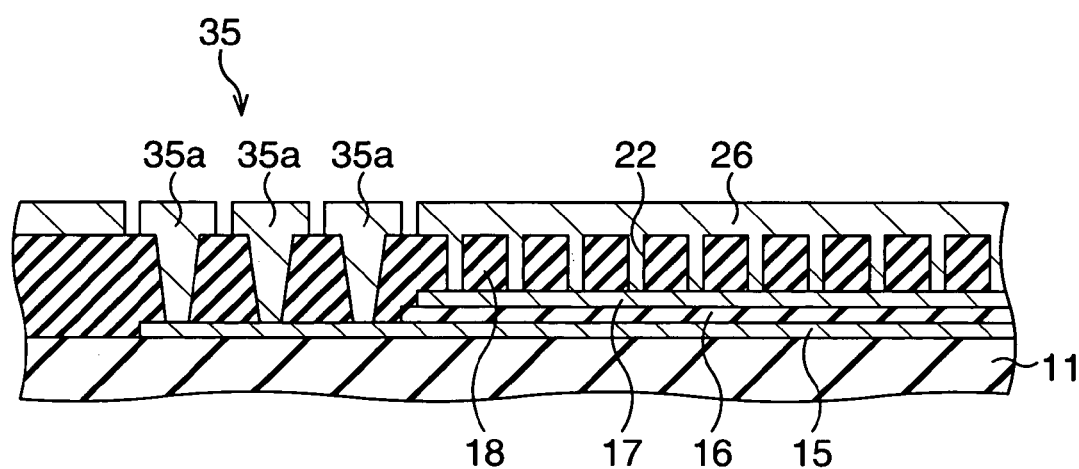

Next, a barrier metal film, an Al film and a barrier metal film are formed on the entire surface and patterned so as to form a wiring portion 23 connected through the contact holes 19 to the bottom electrode 12 and a wiring portion 24 connected through the contact holes 20 to the top electrode 14 (refer to FIGS. 6A and 6B), and also so as to form a wiring portion 35 connected through all of the contact holes 31 to the bottom electrode 15 and a wiring portion 26 connected through the contact holes 22 to the top electrode 17, as shown in FIGS. 10A and 10B. In this case, the wiring portion 35 has a plurality of extended portions 35a extended like comb teeth formed in the direction perpendicular to the longitudinal direction of the bottom electrode 15 so that each of the extended portions 35a is connected to the bottom electrode 15 through a row of the contact hole 31. As for the barrier metal film, Al film (Al wire) and barrier metal film configuring the wiring portions, a TiN film about 150 nm thick, an Al film about 550 nm thick and a TiN film about 150 nm thick are formed, respectively, for instance. However, they are not limited thereto. For instance, the barrier metal film may be configured by a TiN film, a Ti film and a TiN film as with the embodiments described later.

Thereafter, to eliminate moisture in the interlayer insulating film 18, heat treatment is implemented for 60 minutes in an atmosphere of $N_2$ at 350° C. And then, the semiconductor device (ferroelectric memory) is completed by further forming the upper-layer wirings, interlayer insulating films and the like.

According to the second embodiment, the area of the portion deviated from the contact holes 31 of the wiring portion 35 becomes smaller by the gaps of the comb teeth in comparison with the conventional structure so that the amount of Al which reacts is reduced. Consequently, as with the first embodiment, the reaction between the bottom electrode 15 and the Al wire in the wiring portion 35 hardly occurs, and so it is possible to avoid the problems such as rise in contact resistance, breaking and deformation.

Third Embodiment

Figure 11:
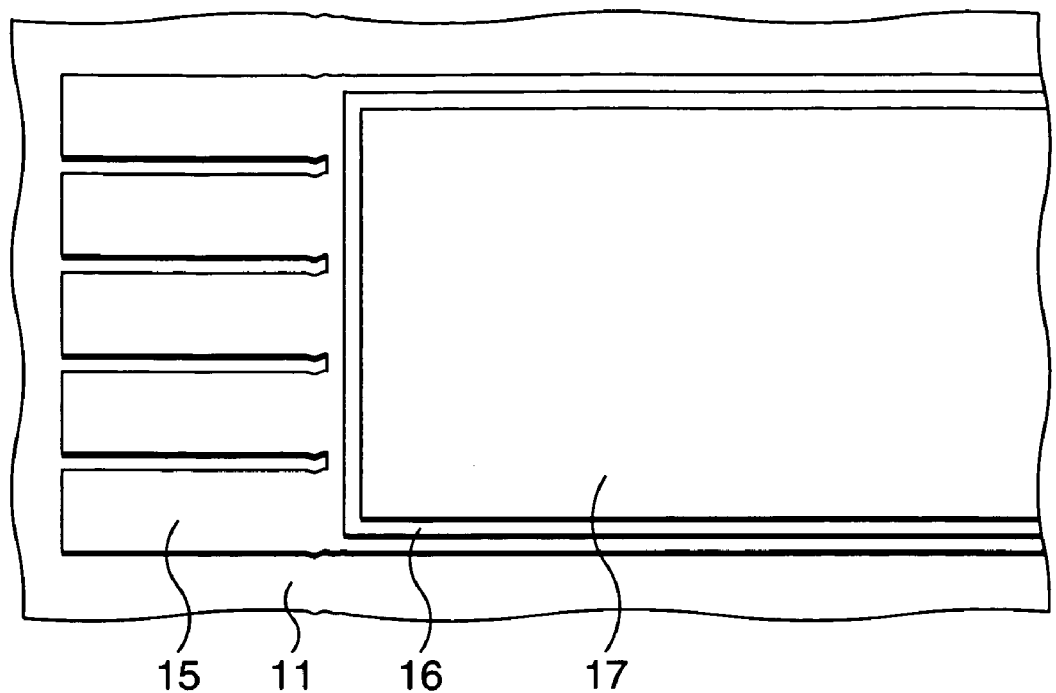
FIG. 11 is a view showing a manufacturing method of a semiconductor device according to a third embodiment of the present invention.
Figure 12:
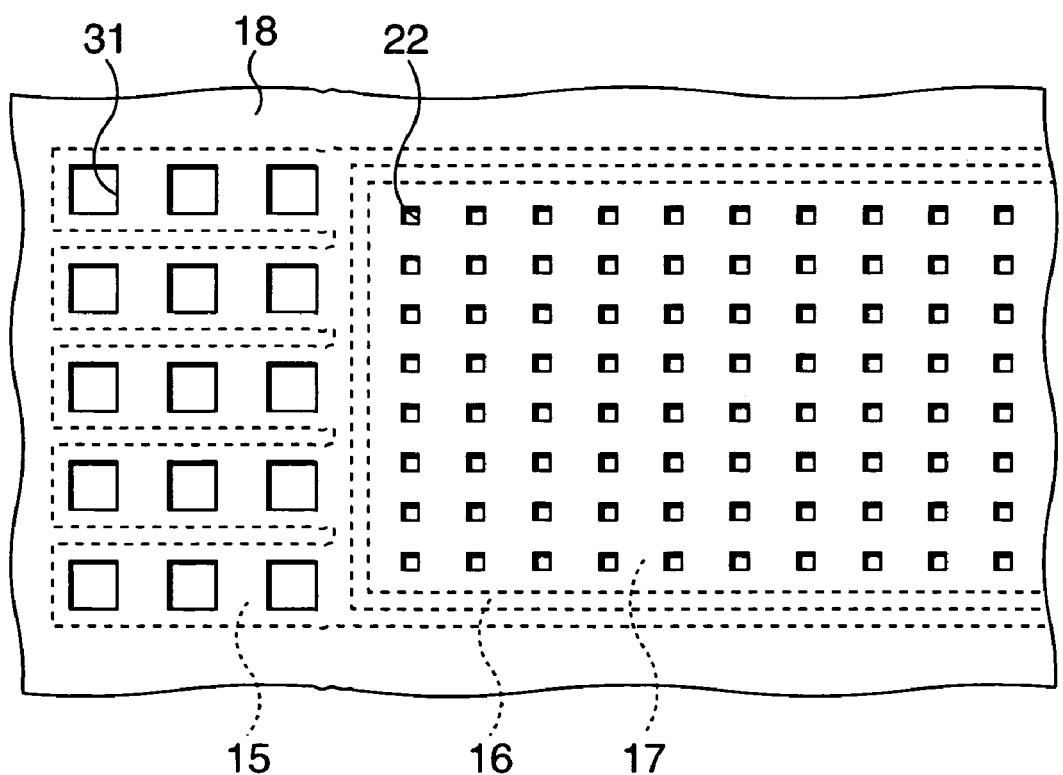
FIG. 12 is a view, following FIG. 11, showing the manufacturing method of the semiconductor device according to the third embodiment of the present invention.
Figure 13:
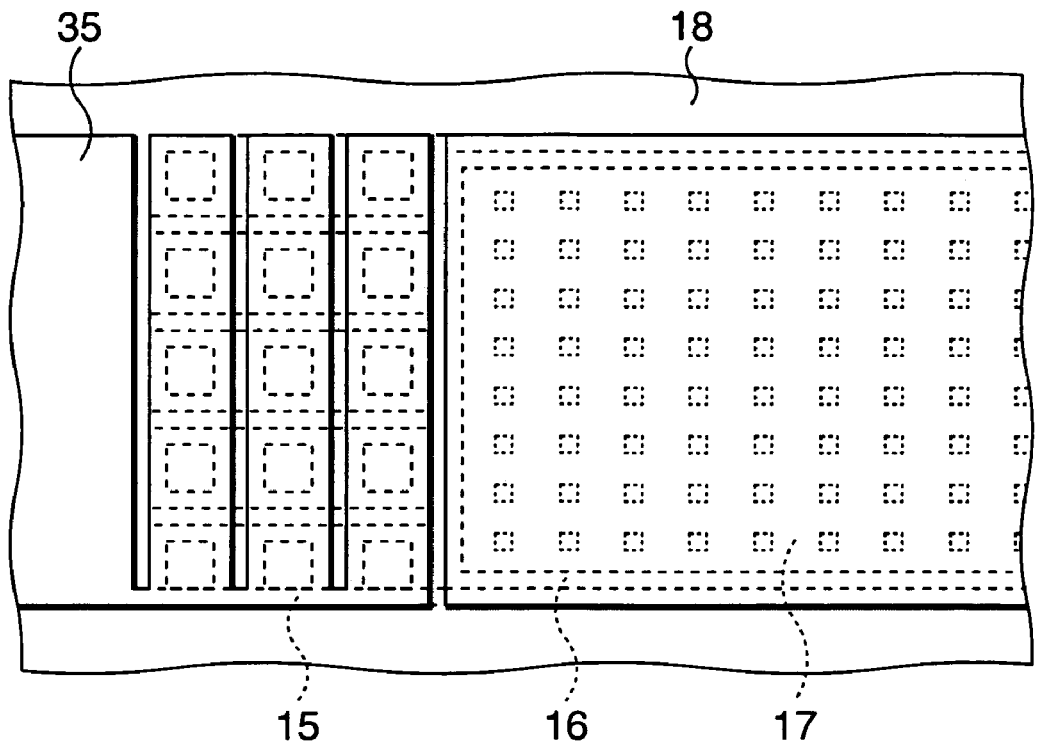
FIG. 13 is a view, following FIG. 12, showing the manufacturing method of the semiconductor device according to the third embodiment of the present invention.

Next, a third embodiment of the present invention will be described. The third embodiment is a combination of the first and second embodiments. FIGS. 11 to 13 are the views showing the manufacturing method of the semiconductor device according to the third embodiment of the present invention.

According to the third embodiment, as with the first embodiment, an element such as a CMOS transistor is first formed on a semiconductor substrate, e.g., an Si substrate, and then an interlayer insulating film, a wiring and so on are formed, and an alumina film 11 is formed as shown in FIGS. 8A and 8B. Next, a bottom electrode film and a ferroelectric film are sequentially formed on the alumina film 11. As for the bottom electrode film, a Pt film about 150 nm thick is formed for instance. As for the ferroelectric film, a PZT film about 150 nm thick is formed for instance. Next, the ferroelectric film is crystallized by performing rapid heat treatment at about 750° C. Thereafter, an $IrO_x$ film about 250 nm thick, for instance, is formed as a top electrode film on the ferroelectric film. These films are processed in order of the top electrode film, the ferroelectric film, and the bottom electrode film so as to form a bottom electrode 12, a PZT film 13, and a top electrode 14 (refer to FIGS. 2A and 2B) in an area in which the FeRAM cell array 1 is to be formed (second area) and so as to form a bottom electrode 15, a PZT film 16, and a top electrode 17 in an area in which the peripheral circuit 2 is to be formed (first area), as shown in FIG. 11. In this case, the notches are formed on each bottom electrode 15 as with the first embodiment.

After processing these films, a TEOS oxide film 18 about 1.5 μm thick, for instance, is formed as an interlayer insulating film and is flattened through CMP. Next, in the TEOS oxide film 18, the alumina film 11 and the like, contact holes (not shown) are formed to reach a diffusion layer (semiconductor substrate) or the like formed below the bottom electrodes 12 and 15. Next, contact holes 31 reaching the bottom electrode 15 and contact holes 22 reaching the top electrode 17 are formed in the TEOS oxide film 18 in the first area as shown in FIG. 11, and contact holes 19 reaching the bottom electrode 12 and contact holes 20 reaching the top electrode 14 are formed in the TEOS oxide film 18 in the second area (refer to FIGS. 4A and 4B). In this case, in the first area, a plurality of contact holes 31 are formed for each of the bottom electrode 15 at intervals of about 1.3 μm in the longitudinal direction on the end of the side having the notches formed.

Next, a barrier metal film, an Al film and a barrier metal film are formed on the entire surface and patterned so as to form a wiring portion 23 connected through the contact holes 19 to the bottom electrode 12 and a wiring portion 24 connected through the contact holes 20 to the top electrode 14 (refer to FIGS. 6A and 6B), and also so as to form a wiring portion 35 connected through all of the contact holes 31 to the bottom electrode 15 and a wiring portion 26 connected through the contact holes 22 to the top electrode 17 as shown in FIG. 12. In this case, as with the second embodiment, the wiring portion 35 has a plurality of extended portions 35a extended like comb teeth formed in the direction perpendicular to the longitudinal direction of the bottom electrode 15 so that each of the extended portions 35a is connected to the bottom electrode 15 through a row of the contact holes 31. As for the barrier metal film, Al film (Al wire) and barrier metal film configuring the wiring portions, a TiN film about 150 nm thick, an Al film about 550 nm thick, and a TiN film about 150 nm thick are formed, respectively, for instance. However, they are not limited thereto. For instance, the barrier metal film may be configured by a TiN film, a Ti film and a TiN film as with the embodiments described later.

Thereafter, to eliminate moisture in the interlayer insulating film 18, heat treatment is implemented for 60 minutes in an atmosphere of $N_2$ at 350° C. And then, the semiconductor device (ferroelectric memory) is completed by further forming the upper-layer wirings, interlayer insulating films and the like.

According to the third embodiment, the amounts of Pt and Al which react are reduced further than the first and second embodiments so that it is possible to further avoid the problems.

First Experiment Example

Here, an experiment on the first to third embodiments performed by the inventors hereof will be described.

In this experiment, the semiconductor devices according to the first to third embodiments and the conventional semiconductor device were manufactured to monitor the wiring portions and the vicinity of a boundary of the bottom electrodes. Consequently, in comparison with the conventional semiconductor device which generated a depression in conjunction with the reaction, the semiconductor devices according to the first to third embodiments had no such a depression whatsoever. However, a little change in color occurred in the first and second embodiments while there was no change in color in the third embodiment.

This experiment adopted the layout shown in Table 1 as to each of the semiconductor devices. The numerical values in Table 1 represent relative values of an area of the portions outside the contact holes in a case where an area inside the contact holes is 1 in a region where the bottom electrode overlaps the Al wire on a plan view. As for the FeRAM cell array, as to any one of the semiconductor devices, the relative value of the area of the portions outside the contact holes is 0.97 in the case where the area inside the contact holes is 1.

It is noted, from Table 1, that the relative value of the area of the portions outside the contact holes to the area inside the contact holes is preferably 2.0 or less, and more preferably be 1.9 or less, further preferably 1.8 or less and still further preferably 1.3 or less in particular in the area where the bottom electrode overlaps the Al wire on the plan view.

Fourth Embodiment

Figure 14:
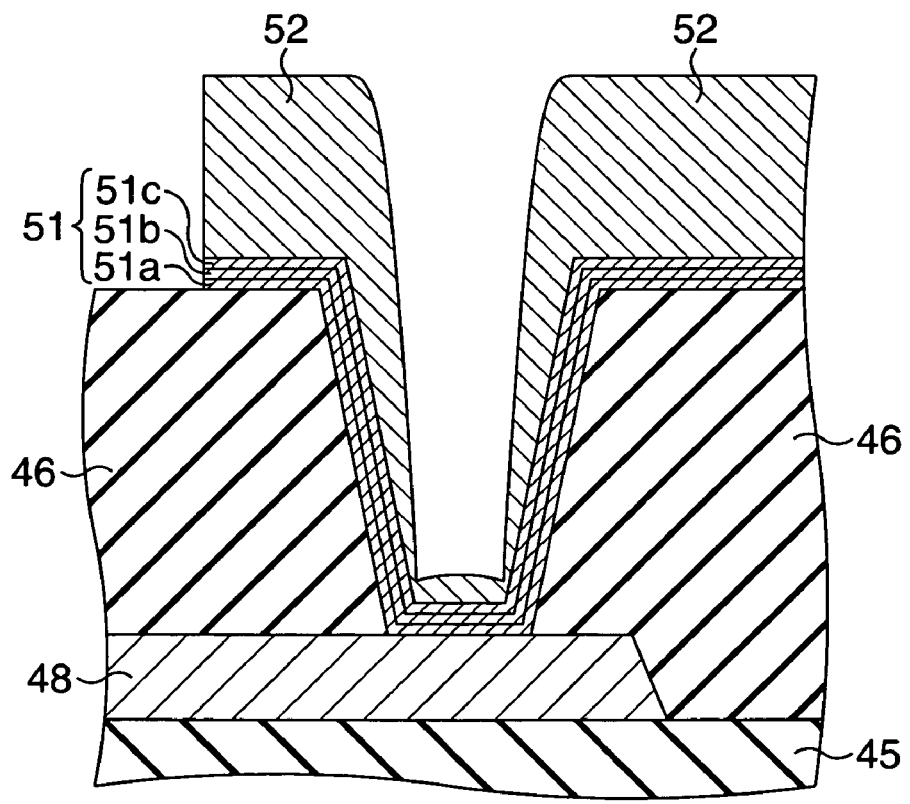
FIG. 14 is a sectional view showing a connection area between a bottom electrode and a wiring in a fourth embodiment of the present invention.
Figure 15:
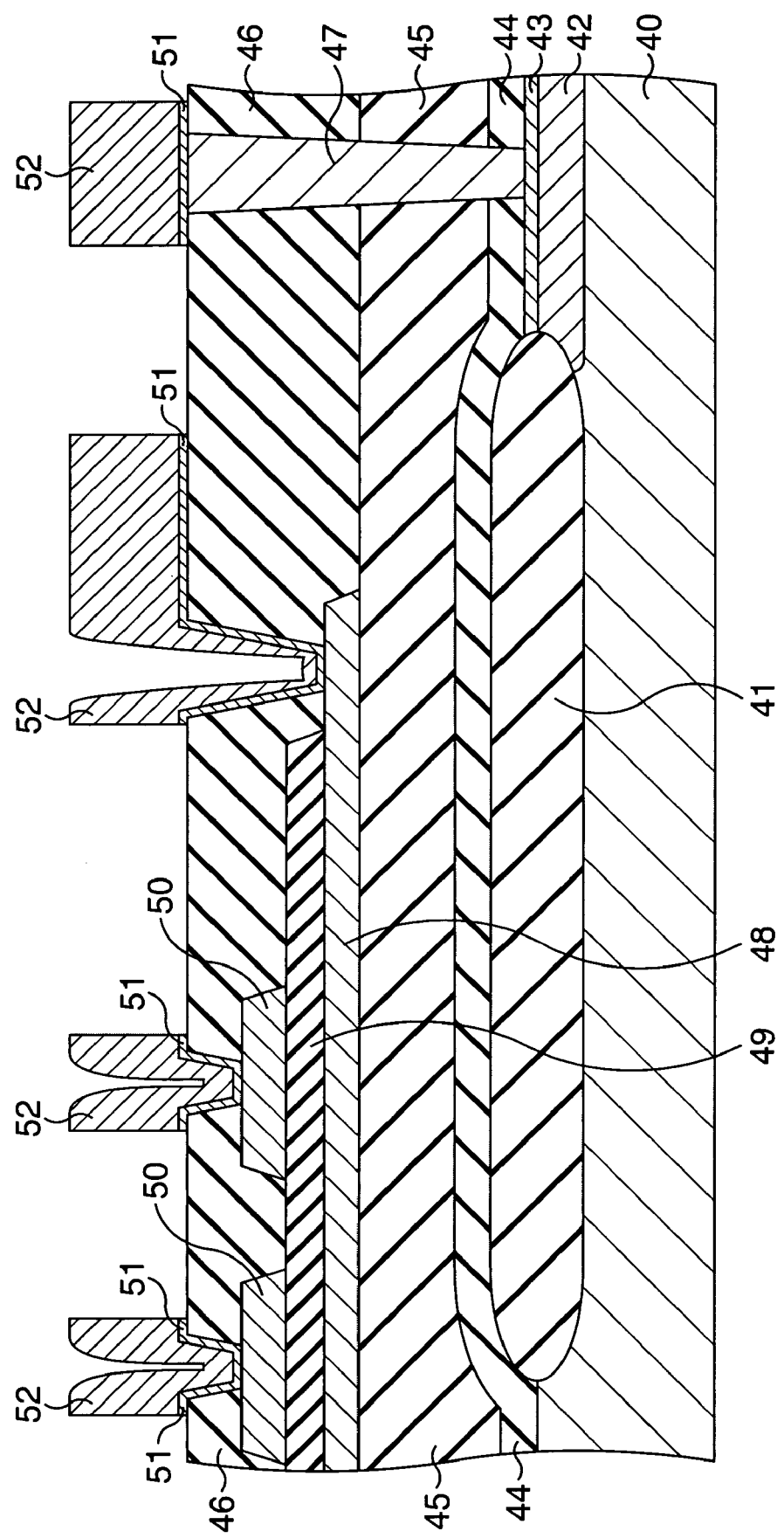
FIG. 15 is a sectional view showing a semiconductor device according to the fourth embodiment of the present invention.

Next, a fourth embodiment of the present invention will be described. The fourth embodiment uses a barrier metal film consisting of the sequentially formed a TiN film, a Ti film and a TiN film. FIG. 14 is a sectional view showing a connection area between a bottom electrode and a wiring in the fourth embodiment of the present invention. FIG. 15 is a sectional view showing a semiconductor device according to the fourth embodiment of the present invention.

According to the fourth embodiment, an element isolation area 41 is formed on the surface of a semiconductor substrate 40 such as an Si substrate. A diffusion layer 42 is formed in an element active area defined by the element isolation region 41. A silicide layer 43 is formed on the surface of the diffusion layer 42. Insulating films 44 and 45 such as an Si oxide film are formed in such a way as to cover the element isolation area 41 and the element active area. A ferroelectric capacitor including a bottom electrode 48, a ferroelectric film 49 and a top electrode 50 is formed on the insulating film 45. Furthermore, an interlayer insulating film 46 such as the Si oxide film is formed in such a way as to cover the ferroelectric capacitor.

Contact holes reaching to the silicide layer 43 is formed in the insulating films 46, 45 and 44, and a W plug 47 is buried therein. Contact holes reaching to the top electrode 50 and contact holes reaching to the bottom electrode 48 are formed in the insulating film 46. Wiring portion including a barrier metal film 51 and an Al film (Al wire) 52 are formed on the insulating film 46. A part of the wiring portion is connected to the W plug 47, another part thereof is connected through the contact holes to the bottom electrode 48, and a further part thereof is connected through the contact holes to the top electrode 50.

For instance, the bottom electrode 48 and top electrode 50 consist of Pt and $IrO_x$, respectively. The barrier metal film 51 is configured by a TiN film 51a about 75 nm thick, a Ti film 51b about 5 nm thick and a TiN film 51c about 75 nm thick, for instance, as shown in FIG. 14.

Here, a description will be given as to a process for forming the ferroelectric capacitor and thereafter concerning the manufacturing method of the semiconductor device according to the fourth embodiment.

When forming the ferroelectric capacitor, the insulating film 45 is formed and is then flattened, and a bottom electrode film (Pt film) and a ferroelectric film (PZT film, for instance) are sequentially formed thereon. Next, annealing is performed in the presence of oxygen so as to crystallize the ferroelectric film. And then, the top electrode film ($IrO_x$ film) is formed on the ferroelectric film.

Thereafter, these films are processed in order of the top electrode film, the ferroelectric film and the bottom electrode film. In this process, the top electrode film is patterned first by sputter etching using a resist mask so as to form the top electrode 50. Next, annealing is performed in the presence of oxygen. Next, the ferroelectric film is processed by sputter etching using another resist mask so as to form the ferroelectric film 49. And the bottom electrode film is processed by sputter etching using a further other resist mask so as to form the bottom electrode 48.

Next, the insulating film 46 is formed on the entire surface and is flattened through CMP for instance. And then, dry etching is performed by using a resist mask so as to form the contact holes reaching to the silicide layer 43. Thereafter, a TiN film (not shown) as a barrier metal film and a W film are formed in such a way as to bury them in the contact holes so as to form the W plug 47 by performing CMP thereto. Subsequently, dry etching is performed by using a resist mask so as to form the contact holes reaching to the top electrode 50 and the contact holes reaching to the bottom electrode 48.

Next, a TiN film (75 nm), a Ti film (5 nm) and a TiN film (75 nm) configuring the barrier metal film 51 are sequentially formed, and then, annealing is performed in the presence of nitrogen. A condition for the annealing is 30 minutes at 350° C. for instance. Next, an Al film configuring the Al wire 52 is formed. And the Al film, TiN film, Ti film and TiN film are patterned to form the barrier metal film 51 consisting of the TiN film (first TiN film) 51a, Ti film 51b and TiN film (second TiN film) 51c, and the wiring 52 consisting of the Al film.

Thereafter, the interlayer insulating film, the wiring and the like are further formed to complete the semiconductor device.

According to the fourth embodiment, the Ti film 51b prevents Pt in the bottom electrode 48 from diffusing up to the wiring. As the TiN film 51a is formed between the Ti film 51b and the bottom electrode 48, generation of $TiO_x$ is also prevented. Furthermore, the TiN film 51c is formed between the Ti film 51b and the wire (Al wire) 52 so as to prevent the reaction between Ti and Al and electromigration in conjunction with it.

As for thickness of the barrier metal film 51, the thickness of the TiN film 51a and TiN film 51c is preferably 50 nm or more. This is because if the TiN film 51a or the TiN film 51c is less than 50 nm thick, the reaction is apt to occur between the Ti film 51b and the bottom electrode 48 or the wire 52. In addition, the thickness of the Ti film 51b is preferably 5 nm or more. This is because, if the Ti film 51b is less than 5 nm thick, the reaction is apt to occur between the bottom electrode 48 and the wire 52.

When forming the TiN film 51a configuring the barrier metal film, it is preferable to perform two processes of formation under conditions easily causing accumulation in the bottom of the contact hole and formation under conditions easily causing accumulation in a side wall portion of the contact hole. Conventionally, the formation has only been performed under the conditions easily causing the accumulation in the bottom of the contact hole. To be exact, however, there are many cases where RF preprocessing is performed before forming the barrier metal film for the purposes of eliminating a natural oxide film and the like. Consequently, it is sometimes found that Pt adheres to the side wall portion of the contact hole. For this reason, in the case of only forming the TiN film under the conditions easily causing the accumulation in the bottom of the contact hole, there may be a reaction between Pt adhering to the side wall portion and a Ti film configuring the barrier metal film. On the other hand, it is possible to avoid such a problem by forming the TiN film also under the conditions easily causing the accumulation in the side wall portion of the contact hole. It is preferable, from a viewpoint of coverage, to form the TiN film first under the conditions easily causing the accumulation in the bottom of the contact hole.

It is also possible to form a TiN film in the contact hole and form an $IrO_x$ film (iridium oxide film) thereon so as to form the barrier metal film out of the two films. Even in such a configuration, the $IrO_x$ film suppresses the diffusion of Al to the bottom electrode side. The thickness of the $IrO_x$ film is preferably 50 nm or more, or $1/20$ or more of depth of the contact hole. Furthermore, it is also possible to form a TiN film on the $IrO_x$ film in order to further suppress a reaction between the $IrO_x$ film and Al as a wiring material.

To improve adhesion between the TiN film and the $IrO_x$ film, a Ti film may be formed between them. In this case, for the sake of further suppressing the reaction between the Ti film and Pt in the side wall portion of the contact hole, it is preferable, when forming the TiN film in contact with the bottom electrode, to form a part of the TiN film under the conditions easily causing the accumulation in the bottom of the contact hole and then form the other part of the TiN film under the conditions easily causing the accumulation in the side wall portion of the contact hole as described above.

Second Experiment Example

Here, an experiment on the fourth embodiment actually performed by the inventors hereof will be described.

In this experiment, the semiconductor device according to the fourth embodiment and the conventional semiconductor device were manufactured to measure the contact resistance by performing an accelerated test. As for the conventional semiconductor device, the thickness of the barrier metal film 151 consisting of TiN was 150 nm. The results thereof are shown in FIG. 16.

Figure 16:
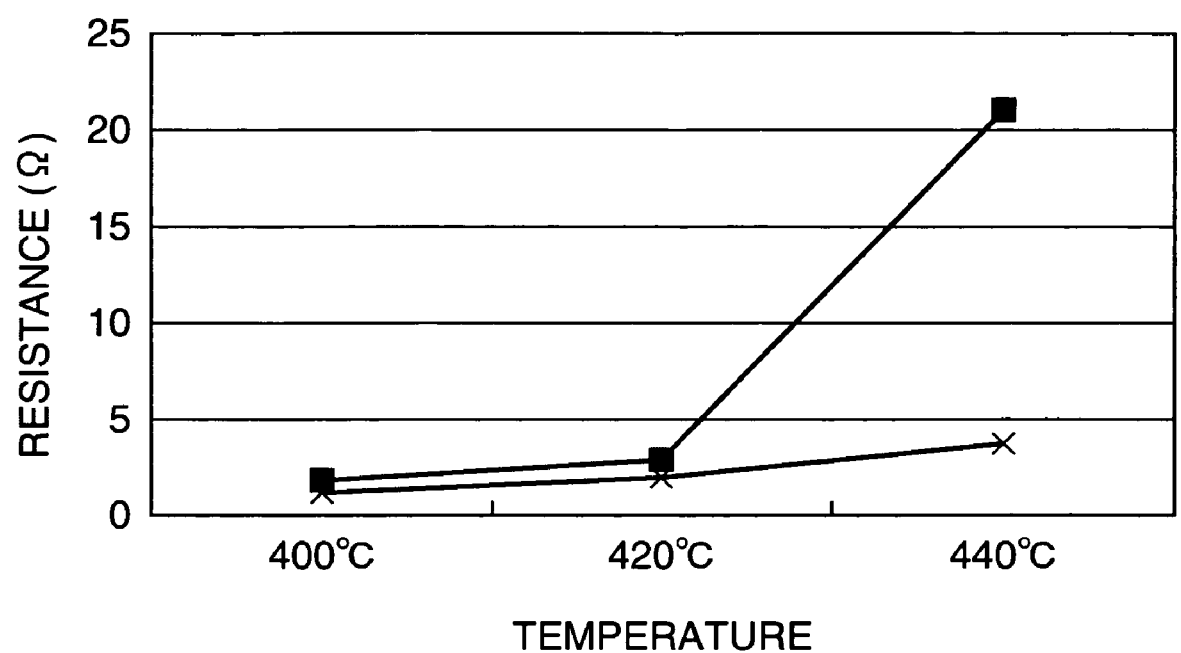
FIG. 16 is a graph showing a result of a second experiment example.

As shown in FIG. 16, neither semiconductor device showed a significant increase in the contact resistance at 400° C. and 420° C. At 440° C., the contact resistance hardly rose as to the fourth embodiment while it rose remarkably as to the conventional semiconductor device. There was also expansion on the surface of the conventional semiconductor device after the accelerated test. It is considered that there were such phenomena because of the eutectic reaction between Pt and Al which occurred in the conventional semiconductor device due to heating at 440° C.

Fifth Embodiment

Figure 17:
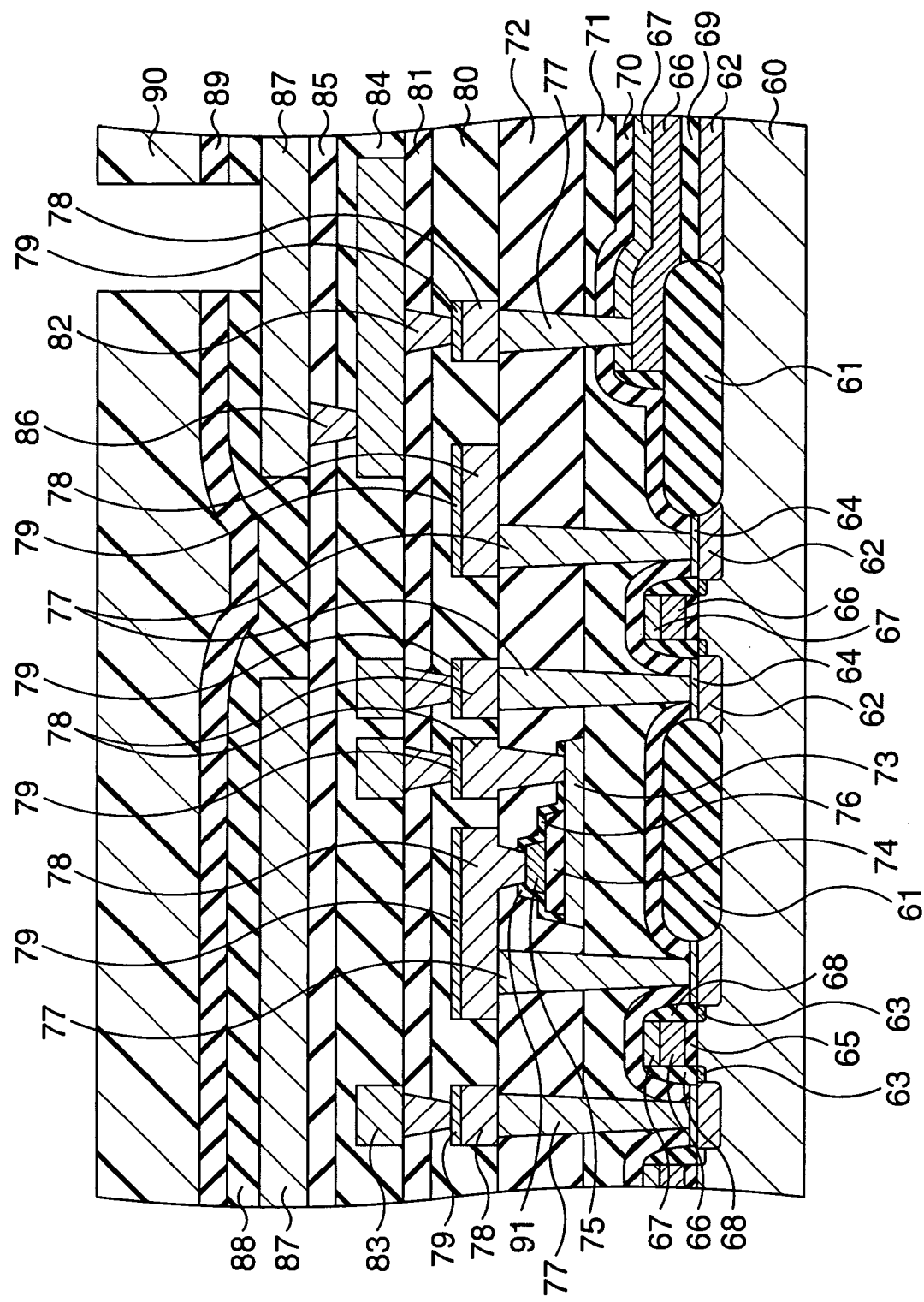
FIG. 17 is a sectional view showing a manufacturing method of a semiconductor device according to a fifth embodiment of the present invention.
Figure 18A:
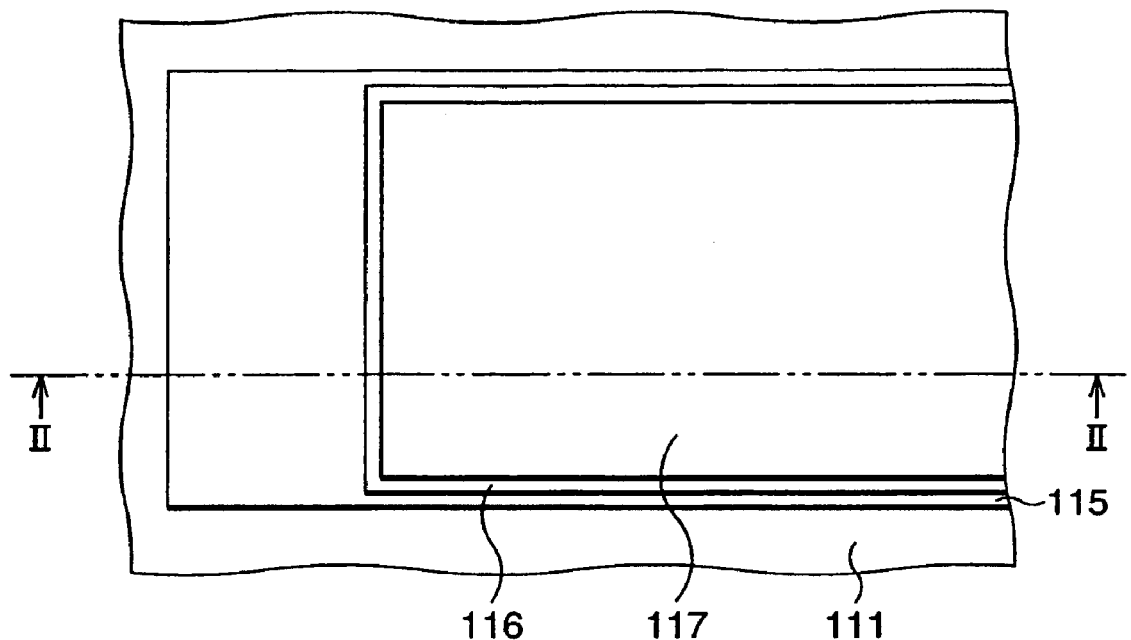
FIGS. 18A and 18B are views showing a manufacturing method of a conventional semiconductor device.
Figure 18B:
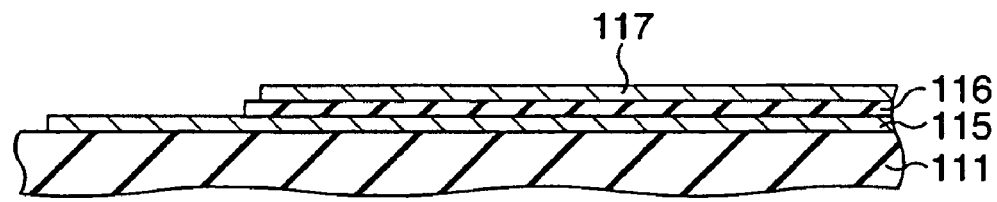
Figure 19A:
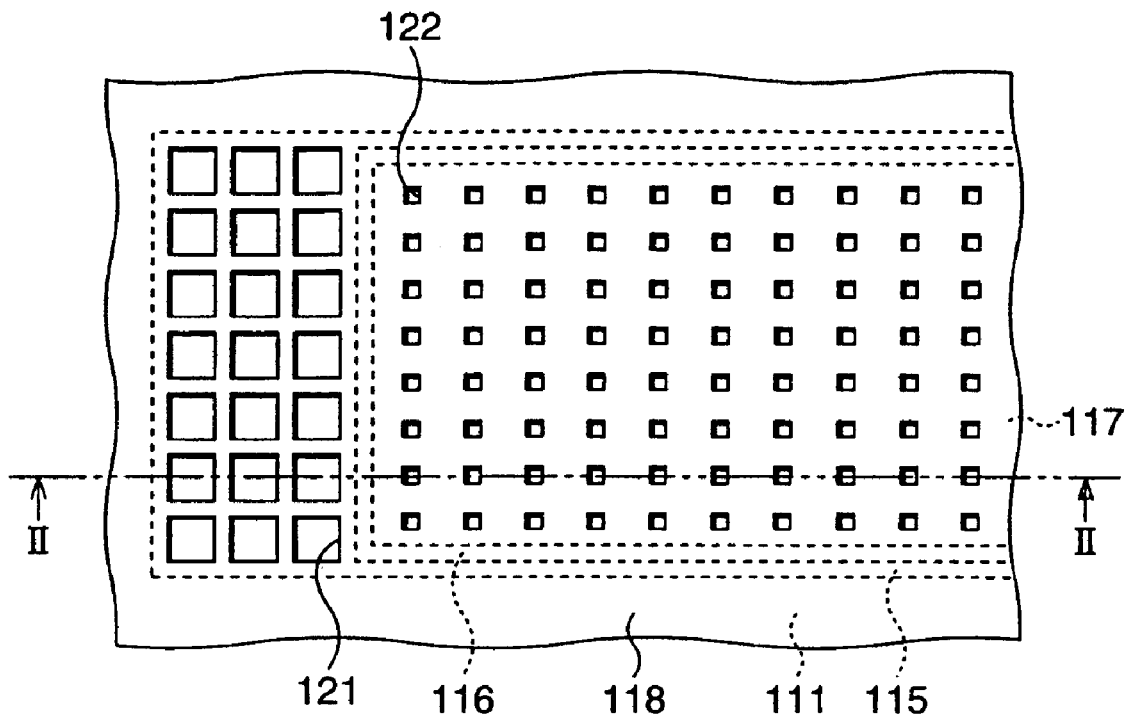
FIGS. 19A and 19B are views, further to FIGS. 18A and 18B, showing the manufacturing method of the conventional semiconductor device.
Figure 19B:
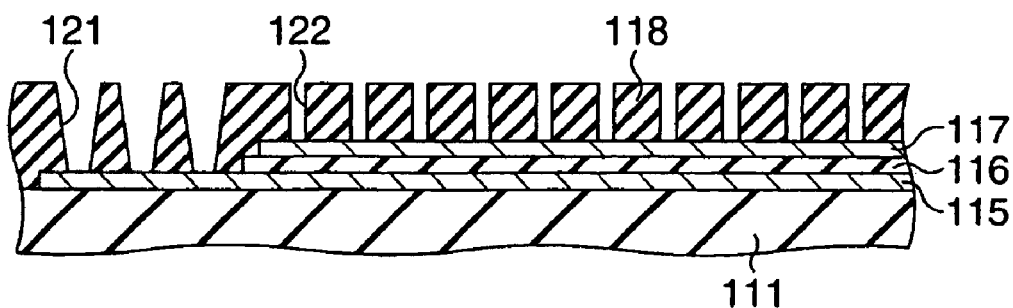
Figure 20A:
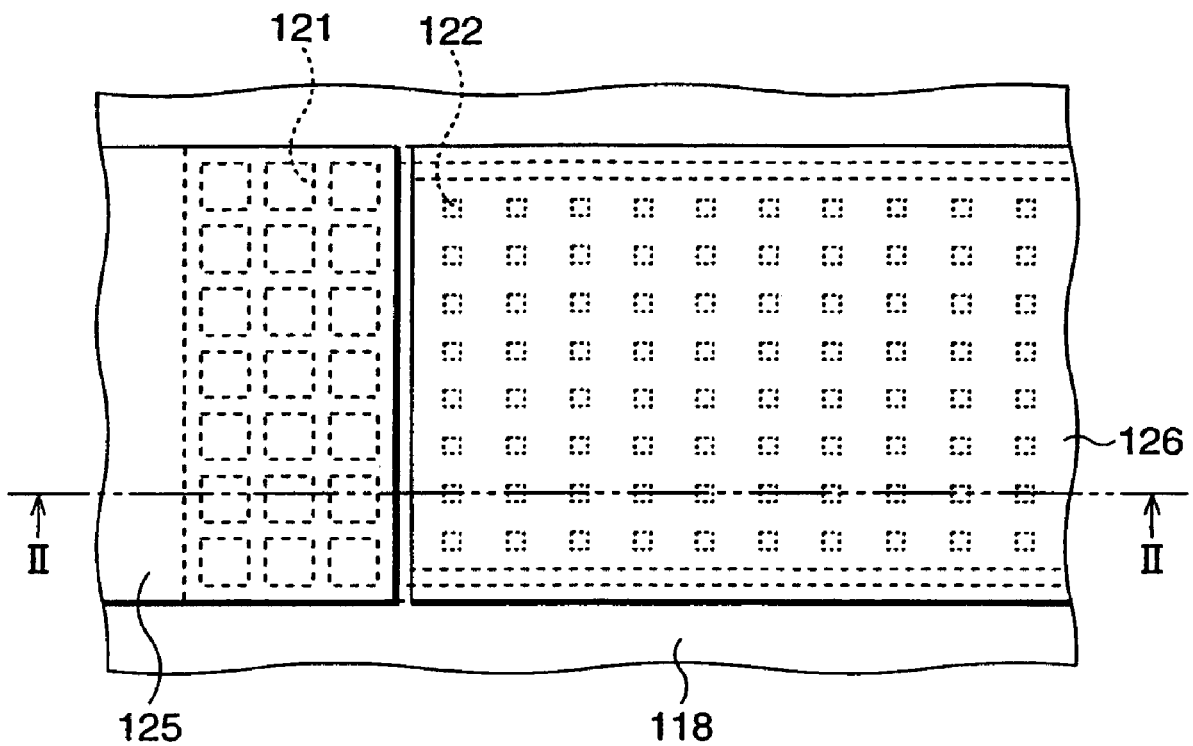
FIGS. 20A and 20B are views, following FIGS. 19A and 19B, showing the manufacturing method of the conventional semiconductor device.
Figure 20B:
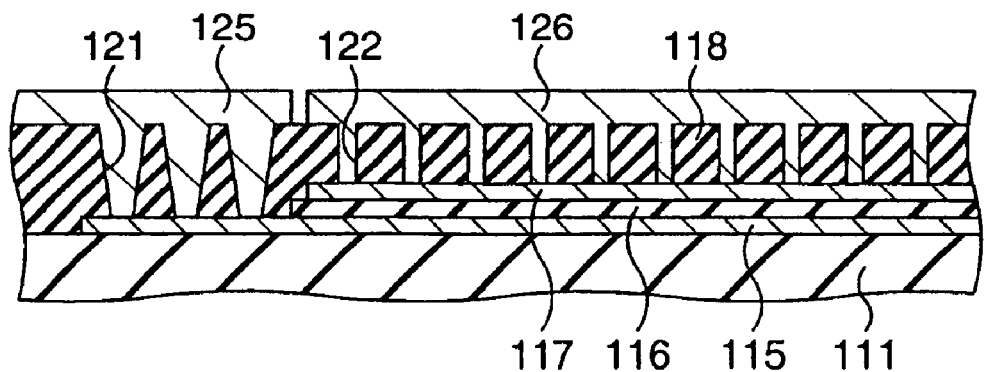
Figure 21A:
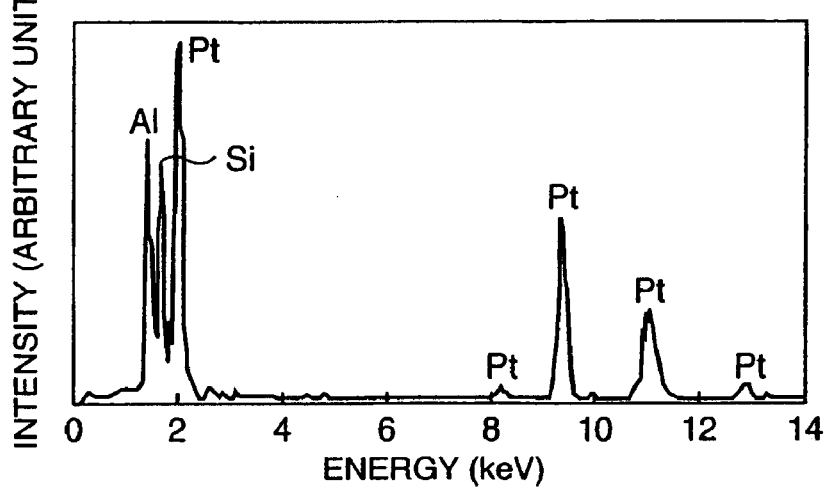
FIGS. 21A to 21C are graphs showing results of a composition analysis of a wiring in the vicinity of a contact portion.
Figure 21B:
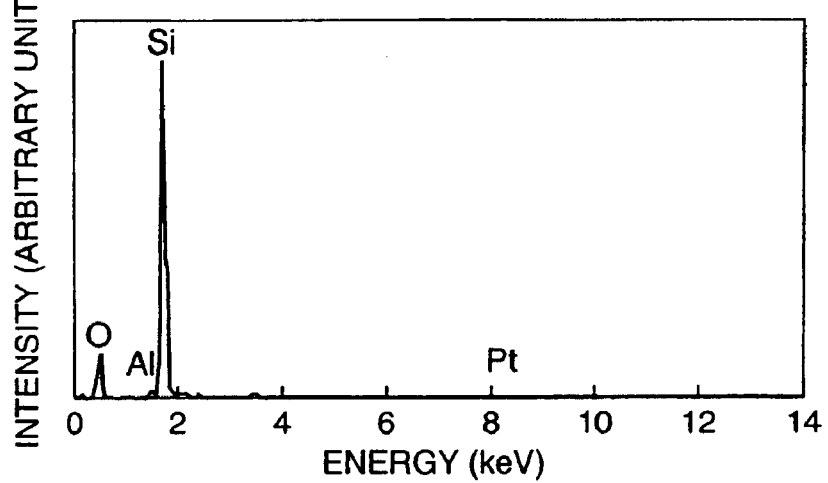
Figure 21C:
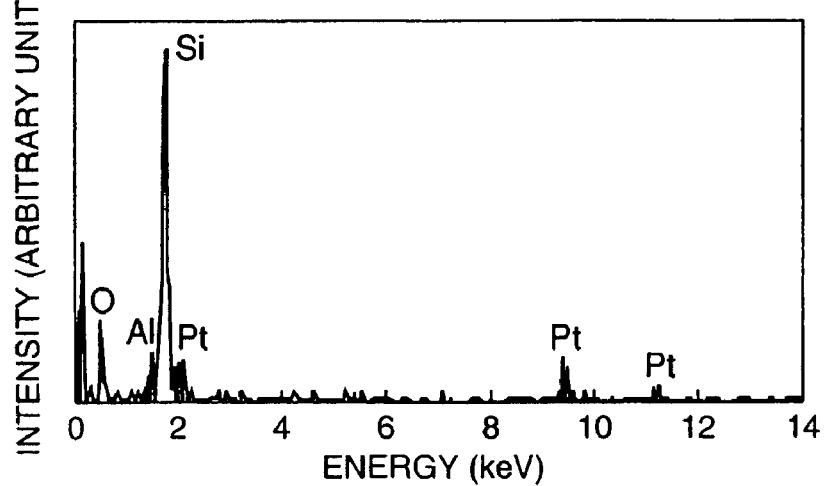
Figure 22:
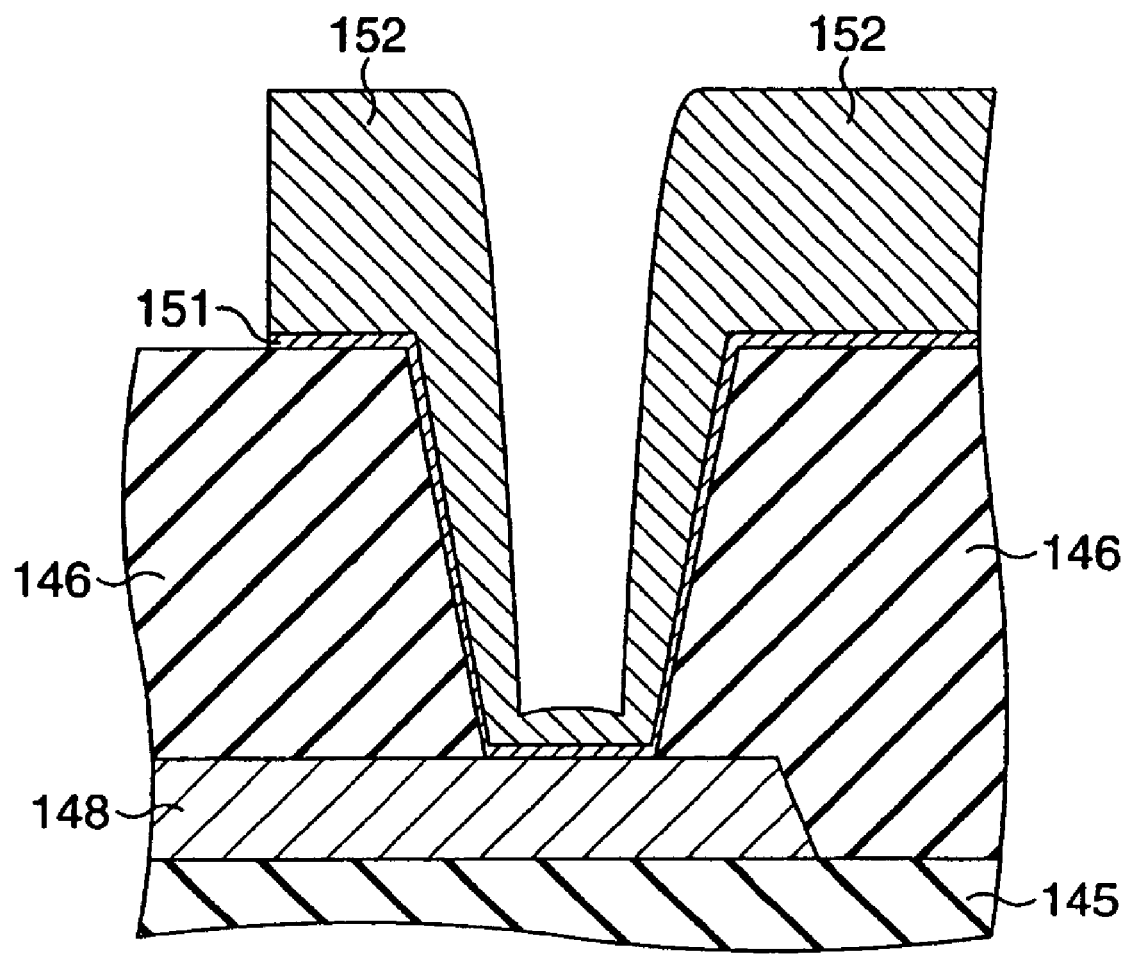
FIG. 22 is a sectional view showing a connection area between a bottom electrode and a wiring of a conventional semiconductor device.

Next, a fifth embodiment of the present invention will be described. The fifth embodiment uses Ir or Pt instead of Al as the wiring material. FIG. 17 is a sectional view showing a manufacturing method of a semiconductor device according to the fifth embodiment of the present invention.

According to the present embodiment, an element isolation area 61 is formed on the surface of an Si substrate (semiconductor substrate) 60. Thereafter, an element such as a transistor is formed in the element active area defined by the element isolation area 61. The transistor may have a high concentration impurity diffusion layer 62, a low concentration impurity diffusion layer 63, a silicide layer 64, a gate insulating film 65, a gate electrode 66, a silicide layer 67 and a side wall 68. An insulating film 69 is formed, for instance, between the gate electrode 66 and the diffusion layer 62 in the vicinity of the contact portion of the gate electrode 66.

Thereafter, insulating films 70 and 71 such as an Si oxide film are formed on the entire surface and the insulating film 71 is then flattened, and a bottom electrode film (Pt film) and a ferroelectric film (PZT film for instance) are sequentially formed thereon. Next, annealing is performed in the presence of oxygen so as to crystallize the ferroelectric film. And then, a top electrode film (IrO$_x$ film) is formed on the ferroelectric film.

Thereafter, these films are processed in order of the top electrode film, the ferroelectric film and the bottom electrode film. In this process, the top electrode film is patterned first by sputter etching using a resist mask so as to form a top electrode 75. Next, annealing is performed in the presence of oxygen. Subsequently, the ferroelectric film is processed by sputter etching using another resist mask so as to form a ferroelectric film 74. Thereafter, the alumina film is formed on the entire surface, and the alumina film and the bottom electrode film are processed by sputter etching using still another resist mask so as to form an alumina protective film 91 and a bottom electrode 73.

Next, an interlayer insulating film 72 is formed on the entire surface and is flattened through CMP, for instance. And then, dry etching is performed by using a resist mask so as to form contact holes reaching to the silicide layer 64 and so on.

Thereafter, a TiN film (not shown) as a barrier metal film and a W film are formed in such a way as to bury them in the contact holes so as to form a W plug 77 by performing CMP thereto. Subsequently, dry etching is performed by using a resist mask so as to form contact holes reaching to the top electrode 75 and contact holes reaching to the bottom electrode 73.

Next, a TiN film configuring a barrier metal film is formed, and then a metal film such as a Pt film or an Ir film configuring a wiring is formed. Furthermore, a TiN film is formed as a hard mask on the metal film. Subsequently, dry etching is performed by using a resist mask to pattern only the TiN film on the metal film and thereby form a hard mask 79. Thereafter, the resist mask is eliminated by an ashing process, and then dry etching is performed by using the hard mask 79 to pattern the metal film and the TiN film under it so as to form a wiring 78 and the barrier metal film (not shown). As for the dry etching, a dry etching apparatus capable of heating up to 300° C. or higher is used, for instance, and etching conditions are temperature: 300° C. or higher, gas flow rate: HBr/O$_2$=10 sccm/40 sccm, and pressure: 0.6 Pa, for instance. As regards the dry etching, the rate of halogen (Cl$_2$, Hbr, and so on) in etching gas is preferably 0.4 or less.

Next, insulating films 80 and 81 such as an Si oxide film are formed, and the contact holes reaching to the hard mask 79 are formed thereon. Subsequently, W plugs 82 are formed in the contact holes, and then a barrier metal film and a wiring 83 are formed on the insulating film 81. The hard mask 79 is used as the barrier metal film between the wiring 83 and the wiring 78 without being eliminated after the dry etching for forming the wiring 78. As the hard mask 79 is formed in a flat part, its barrier property is so high that, even when the wiring 83 is the Al wire, no eutectic reaction occurs between the wirings.

Subsequently, insulating films 84 and 85 such as an Si oxide film are formed, and the contact holes reaching to the wiring 83 are formed thereon. Next, W plugs 86 are formed in the contact holes, and then a wiring 87 is formed on the insulating film 85. Insulating films 88, 89 and a polyimide film 90 are formed as cap films, and a pad opening portion reaching to the wiring 87 is formed thereon.

According to the fifth embodiment, the wiring 78 connected to the bottom electrode 73 and top electrode 75 is composed of the Ir film or the Pt film. Therefore, no eutectic reaction occurs between the wiring 78, and the bottom electrode 73 and top electrode 75.

To process a precious metal film, however, an ordinary method requires a large width to be taken and left so that the form after the processing becomes a taper-like shape. Consequently, wiring resistance may become higher than a value expected from a wiring width. In comparison to this, if the etching is performed in the presence of mixed gas of Cl$_2$ and/or Hbr and O$_2$ at 300° C. or higher as described above, the wiring 78 of low resistance can be obtained. It is not possible to use a conventional photoresist mask in the case of performing such high-temperature etching. However, it is possible to cope with the high-temperature etching by using the TiN film as the hard disk as described above. Even in the atmosphere (halogen+oxygen) for etching the precious metal film, the TiN film is hardly etched and remains as-is. However, it is possible, by using it as the barrier metal film as-is, to prevent the eutectic reaction between the wiring formed thereon and a precious metal wire.

It is also possible to make a plurality of combinations of all or a part of the configurations of the first to fifth embodiments so as to obtain various effects in combination.

INDUSTRIAL APPLICABILITY

As described in detail above, the present invention can suppress an abnormal reaction in the contact portion between the electrode of the ferroelectric capacitor and the wiring connected thereto. For this reason, it is possible to suppress the rise in resistance and further suppress the deformation in manufacturing.

TABLE 1

|  | Inside the contact holes | Outside the contact holes |
| --- | --- | --- |
| First embodiment | 1 | 1.9 |
| Second embodiment | 1 | 1.8 |
| Third embodiment | 1 | 1.3 |
| Conventional example (referential example) | 1 | 2.5 |

What is claimed is:

1. A semiconductor device, comprising:
    a ferroelectric capacitor including a bottom electrode, a ferroelectric film and a top electrode;
    an interlayer insulating film formed on said ferroelectric capacitor, in said interlayer insulating film a plurality of contact holes being formed to said bottom electrode; and
    a wiring formed on said interlayer insulating film and connected to said bottom electrode through said contact holes,
    wherein a first notch is formed in said bottom electrode between lower ends of at least two of the contact holes,
    a second notch is formed in said bottom electrode between lower ends of at least two of said contact holes,
    said contact holes are arranged in an array pattern, and
    said first notch and said second notch are formed in a stripe pattern.

2. The semiconductor device according to claim 1, wherein a gap is formed in said wiring between upper ends of at least two of said contact holes.

3. The semiconductor device according to claim 2, wherein a relative area of portions outside said contact holes is 1.3 or less in a case where an area inside said contact holes is 1 in a region where said wiring overlaps said bottom electrode in a plan view.

4. The semiconductor device according to claim 1, wherein a relative area of portions outside said contact holes is 1.9 or less in a case where an area inside said contact holes is 1 in a region where said wiring overlaps said bottom electrode in a plan view.

5. The semiconductor device according to claim 1, further comprising
    a barrier metal film formed between said bottom electrode and said wiring,
    wherein said barrier metal film comprises:
    a first TiN film in direct contact with said bottom electrode;
    a Ti film formed on said first TiN film; and
    a second TiN film formed on said Ti film.

6. The semiconductor device according to claim 1, further comprising
    a barrier metal film formed between said bottom electrode and said wiring,
    wherein said barrier metal film comprises:
    a first TiN film in direct contact with said bottom electrode; and
    an iridium oxide film formed on said first TiN film.

7. The semiconductor device according to claim 6, wherein said barrier metal film further comprises a second TiN film formed on said iridium oxide film.

8. The semiconductor device according to claim 1, further comprising
    a barrier metal film formed between said bottom electrode and said wiring,
    wherein said barrier metal film comprises:
    a first TiN film in direct contact with said bottom electrode;
    a first Ti film formed on said first TiN film;
    an iridium oxide film formed on said first Ti film;
    a second Ti film formed on said iridium oxide film; and
    a second TiN film formed on said second Ti film.

9. The semiconductor device according to claim 1, wherein said wiring includes an Ir film or a Pt film.

10. The semiconductor device according to claim 9, further comprising a TiN film formed on said wiring.

11. A semiconductor device, comprising:
    a ferroelectric capacitor including a bottom eletrode, a ferroelectric film and a top electrode;
    an interlayer insulating film formed on said ferroelectric capacitor, in said interlayer insulating film a plurality of contact holes being formed to said bottom electrode; and
    a wiring formed on said interlayer insulating film and connected to said bottom electrode through said contact holes,
    wherein a first notch is formed in said wiring between upper ends of at least two of said contact holes,
    a second notch is formed in said wiring between upper end of at least two said contact holes,
    said contact holes are arranged in an array pattern, and
    said first notch and said second notch are formed in a stripe pattern.

12. The semiconductor device according to claim 11, wherein a relative area of portions outside said contact holes is 1.8 or less in a case where an area inside said contact holes is 1 in a region where said wiring overlaps said bottom electrode in a plan view.

13. The semiconductor device according to claim 11, further comprising a barrier metal film formed between said bottom electrode and said wiring,
    wherein said barrier metal film comprises:
    a first TiN film in direct contact with said bottom electrode;
    a Ti film formed on said first TiN film; and
    a second TiN film formed on said Ti film.

14. The semiconductor device according to claim 11, further comprising a barrier metal film formed between said bottom electrode and said wiring,
    wherein said barrier metal film comprises:
    a first TiN film in direct contact with said bottom electrode; and
    an iridium oxide film formed on said first TiN film.

15. The semiconductor device according to claim 14, wherein said barrier metal film further comprises a second TiN film formed on said iridium oxide film.

16. The semiconductor device according to claim 11, further comprising a barrier metal film formed between said bottom electrode and said wiring,
    wherein said barrier metal film comprises:
    a first TiN film in direct contact with said bottom electrode;
    a first Ti film formed on said first TiN film;
    an iridium oxide film formed on said first Ti film;
    a second Ti film formed on said iridium oxide film; and
    a second TiN film formed on said second Ti film.

17. The semiconductor device according to claim 11, wherein said wiring includes an Ir film or a Pt film.

18. The semiconductor device according to claim 17, further comprising a TiN film formed on said wiring.

19. A manufacturing method of a semiconductor device, comprising the steps of:
- forming a ferroelectric capacitor including a bottom electrode, a ferroelectric film and a top electrode;
- forming an interlayer insulating film on the ferroelectric capacitor, in the interlayer insulating film a plurality of contact holes being formed to the bottom electrode; and
- forming a wiring connected to the bottom electrode through the contact holes on the interlayer insulating film,
- wherein, on forming the bottom electrode, a first notch is formed in the bottom electrode between lower ends of at least two of the contact holes,
- a second notch is formed in said bottom electrode between lower ends of at least two of said contact holes,
- said contact holes are arranged in an array pattern, and
- said first notch and said second notch are formed in a stripe pattern.

20. The manufacturing method of a semiconductor device according to claim 19, wherein, on forming the wiring, a gap is formed in the wiring between the upper ends of at least two of the contact holes.

21. The manufacturing method of a semiconductor device according to claim 19, further comprising the step of, between said step of forming the interlayer insulating film and said step of forming the wiring,
- forming a barrier metal film on a bottom and a side of the contact holes,
- wherein said step of forming the barrier metal film comprises the steps of:
- forming a first TiN film in direct contact with the bottom electrode;
- forming a Ti film on the first TiN film; and
- forming a second TiN film on the Ti film.

22. The manufacturing method of a semiconductor device according to claim 21, wherein said step of forming the first TiN film is performed under two kinds of conditions of:
- a first condition; and
- a second condition for having the film formed on the sides of the contact holes more easily than the first condition.

23. The manufacturing method of a semiconductor device according to claim 22, wherein said step of forming the barrier metal film further comprises the step of forming a second TiN film on the iridium oxide film.

24. The manufacturing method of a semiconductor device according to claim 19, further comprising the step of, between said step of forming the interlayer insulating film and said step of forming the wiring,
- forming a barrier metal film on a bottom and a side of the contact holes,
- wherein said step of forming the barrier metal film comprises the steps of:
- forming a first TiN film in direct contact with the bottom electrode; and
- forming an iridium oxide film on the first TiN film.

25. The manufacturing method of a semiconductor device according to claim 19, further comprising the step of, between said step of forming the interlayer insulating film and said step of forming the wiring,
- forming a barrier metal film on a bottom and a side of the contact holes,
- wherein said step of forming the barrier metal film comprises the steps of:
- forming a first TiN film in direct contact with the bottom electrode;
- forming a first Ti film on the first TiN film;
- forming an iridium oxide film on the first Ti film;
- forming a second Ti film on the iridium oxide film; and
- forming a second TiN film on the second Ti film.

26. The manufacturing method of a semiconductor device according to claim 25, wherein said step of forming the first TiN film is performed under two kinds of conditions of:
- a first condition; and
- a second condition for having the film formed on the sides of the contact holes more easily than the first condition.

27. The manufacturing method of a semiconductor device according to claim 25, further comprising the step of annealing between said step of forming the barrier metal film and said step of forming the wiring.

28. The manufacturing method of a semiconductor device according to claim 19, wherein said step of forming the wiring comprises the step of forming an Ir film or a Pt film.

29. The manufacturing method of a semiconductor device according to claim 28, wherein said step of forming the wiring further comprises the steps of:
- patterning the Ir film or the Pt film by dry etching at 300° C or higher.

30. The manufacturing method of a semiconductor device according to claim 29, wherein, on the dry etching, a gas including a halogen gas of $Cl_2$ or HBr and $O_2$ as an etching gas is used with a rate of the halogen gas in the etching gas at 0.4 or less.

31. The manufacturing method of a semiconductor device according to claim 28, wherein said step of forming the wiring further comprises the steps of:
- forming a TiN film on the Ir film or the Pt film;
- patterning the TiN film with using a resist mask so as to form a hard mask;
- eliminating the resist mask; and
- patterning the material film with using the hard mask.

32. A manufacturing method of a semiconductor device, comprising the steps of:
- forming a ferroelectric capacitor including a bottom electrode, a ferroelectric film and a top electrode;
- forming an interlayer insulating film on the ferroelectric capacitor, in the interlayer insulating film a plurality of contact holes being formed to the bottom electrode; and
- forming a wiring connected to the bottom electrode through the contact holes on the interlayer insulating film,
- wherein, on forming the wiring, a first notch is formed in the wiring between upper ends of at least two of the contact holes,
- a second notch is formed in said wiring between upper ends of at least two of said contact holes,
- said contact holes are arranged in an array pattern, and
- said first notch and said second notch are formed in a stripe pattern.

33. The manufacturing method of a semiconductor device according to claim 32, further comprising the step of, between said step of forming the interlayer insulating film and said step of forming the wiring, forming a barrier metal film on a bottom and a side of the contact holes,
- wherein said step of forming the barrier metal film comprises the steps of:
- forming a first TiN film in direct contact with the bottom electrode;
- forming a Ti film on the first TiN film; and
- forming a second TiN film on the Ti film.

34. The manufacturing method of a semiconductor device according to claim 33, wherein said step of forming the first TiN film is performed under two kinds of conditions of:
   a first condition; and
   a second condition for having the film formed on the sides of the contact holes more easily than the first condition.

35. The manufacturing method of a semiconductor device according to claim 34, wherein said step of forming the barrier metal film further comprises the step of forming a second TiN film on the iridium oxide film.

36. The manufacturing method of a semiconductor device according to claim 32, further comprising the step of, between said step of forming the interlayer insulating film and said step of forming the wiring, forming a barrier metal film on a bottom and a side of the contact holes,
   wherein said step of forming the barrier metal film comprises the steps of:
   forming a first TiN film in direct contact with the bottom electrode; and
   forming an iridium oxide film on the first TIN film.

37. The manufacturing method of a semiconductor device according to claim 32, further comprising the step of, between said step of forming the interlayer insulating film and said step of forming the wiring, forming a barrier metal film on a bottom and a side of the contact holes,
   wherein said step of forming the barrier metal film comprises the steps of:
   forming a first TiN film in direct contact with the bottom electrode;
   forming a first Ti film on the first TiN film;
   forming an iridium oxide film on the first Ti film;
   forming a second Ti film on the iridium oxide film; and
   forming a second TiN film on the second Ti film.

38. The manufacturing method of a semiconductor device according to claim 37, wherein said step of forming the first TiN film is performed under two kinds of conditions of:
   a first condition; and
   a second condition for having the film formed on the sides of the contact holes more easily than the first condition.

39. The manufacturing method of a semiconductor device according to claim 37, further comprising the step of annealing between said step of forming the barrier metal film and said step of forming the wiring.

40. The manufacturing method of a semiconductor device according to claim 32, wherein said step of forming the wiring comprises the step of forming an Ir film or a Pt film.

41. The manufacturing method of a semiconductor device according to claim 40, wherein said step of forming the wiring further comprises the step of patterning the Ir film or the Pt film by dry etching at 300° C. or higher.

42. The manufacturing method of a semiconductor device according to claim 41, wherein, on the dry etching, a gas including a halogen gas of $Cl_2$ or HBr and $O_2$ as an etching gas is used with a rate of the halogen gas in the etching gas at 0.4 or less.

43. The manufacturing method of a semiconductor device according to claim 40, wherein said step of forming the wiring further comprises the steps of:
   forming a TiN film on the Ir film or the Pt film;
   patterning the TiN film with using a resist mask so as to form a hard mask;
   eliminating the resist mask; and
   patterning the material film with using the hard mask.

* * * * *